US006275320B1

(12) United States Patent
Dhuler et al.

(10) Patent No.: US 6,275,320 B1
(45) Date of Patent: Aug. 14, 2001

(54) MEMS VARIABLE OPTICAL ATTENUATOR

(75) Inventors: Vijayakumar R. Dhuler, Raleigh; Edward A. Hill; Ramaswamy Mahadevan, both of Chapel Hill; Mark David Walters, Durham; Robert L. Wood, Cary, all of NC (US)

(73) Assignee: JDS Uniphase, Inc. (CA)

( * ) Notice: Subject to any disclaimer, the term of this patent is extended or adjusted under 35 U.S.C. 154(b) by 0 days.

(21) Appl. No.: 09/405,789

(22) Filed: Sep. 27, 1999

(51) Int. Cl.[7] .............................. G02B 26/00; G02B 6/00
(52) U.S. Cl. .................. 359/237; 359/290; 359/291; 359/245; 359/871; 385/140; 310/306
(58) Field of Search .................................. 359/237, 290, 359/291, 295, 298, 308, 871, 872, 321, 322, 245; 385/24, 140, 73; 310/306, 307

(56) References Cited

U.S. PATENT DOCUMENTS

| 1,258,368 | 3/1918 | Smith . |
| 1,658,669 | 2/1928 | Cohn et al. . |
| 3,213,318 | 10/1965 | Glenn, Jr. . |

(List continued on next page.)

FOREIGN PATENT DOCUMENTS

| 38 09 597 A1 | 10/1989 | (DE) . |
| 42 35 593 A1 | 10/1993 | (DE) . |
| 0 469 749 A1 | 2/1992 | (EP) . |

(List continued on next page.)

OTHER PUBLICATIONS

A Biomimetic Micro Motion System; A Ciliary Motion System, M. Ataka et al., Institute of Industrial Science, The University of Tokyo, 4 pgs.

A Large–Aperture Electro–Optic Diffraction Modulator, R. P. Bocker et al., J. Appl. Phys. 50(11), Nov. 1979, pp. 6691–6693.

A Micro Mobile Mechanism Using Thermal Expansion and Its Theoretical Analysis—A Comparison With Impact Drive Mechanism Using Piezoelectric Elements, Y. Yamagata et al., Proceedings of the IEEE Micro Electro Mechanical Systems, 1994, pp. 142–147.

(List continued on next page.)

*Primary Examiner*—Loha Ben
(74) *Attorney, Agent, or Firm*—Myers Bigel Sibley & Sajovec

(57) ABSTRACT

A MEMS (Micro Electro Mechanical System) variable optical attenuator is provided that is capable of optical attenuation over a full range of optical power. The MEMS variable optical attenuator comprises a microelectronic substrate, a MEMS actuator and an optical shutter. The MEMS variable optical attenuator may also comprise a clamping element capable of locking the optical shutter at a desired attenuation position. The variable light attenuator is capable of attenuating optical beams that have their optical axis running parallel and perpendicular to the substrate. Additionally, the MEMS actuator of the present invention may comprise an array of MEMS actuators capable of supplying the optical shutter with greater displacement distances and, thus a fuller range of optical attenuation. In one embodiment of the invention, the MEMS actuator comprises a thermal arched beam actuator. Additionally, the variable optical attenuator of the present invention may be embodied in a thermal bimorph cantilever structure. This alternate embodiment includes a microelectronic substrate and a thermal bimorph cantilever structure having at least two materials of different thermal coefficient of expansion. The thermal bimorph is responsive to thermal activation and moves in the direction of the material having the lower thermal coefficient expansion. Upon activation, the thermal bimorph intercepts the path of the optical beam and provides for the desired level of optical attenuation. The invention also provides for a method of optical attenuation and a method for fabricating an optical attenuator in accordance with the described structures.

63 Claims, 16 Drawing Sheets

U.S. PATENT DOCUMENTS

| | | |
|---|---|---|
| 3,471,641 | 10/1969 | Baker et al. . |
| 3,609,593 | 9/1971 | Bell et al. . |
| 3,631,366 | 12/1971 | Ugon . |
| 4,073,567 | 2/1978 | Lakerveld et al. . |
| 4,143,946 | 3/1979 | Leo et al. . |
| 4,209,689 | 6/1980 | Linford et al. . |
| 4,230,393 | 10/1980 | Burke, Jr. . |
| 4,317,611 | 3/1982 | Petersen . |
| 4,381,672 | 5/1983 | O'Connor et al. . |
| 4,480,162 | 10/1984 | Greenwood . |
| 4,618,223 | 10/1986 | Fried . |
| 4,662,746 | 5/1987 | Hornbeck . |
| 4,708,420 | 11/1987 | Liddiard . |
| 4,710,732 | 12/1987 | Hornbeck . |
| 4,786,149 * | 11/1988 | Hoenig et al. ........................ 359/291 |
| 4,789,803 | 12/1988 | Jacobsen et al. . |
| 4,884,446 | 12/1989 | Ljung . |
| 4,983,021 | 1/1991 | Fergason . |
| 5,016,072 | 5/1991 | Greiff . |
| 5,043,043 | 8/1991 | Howe et al. . |
| 5,061,049 | 10/1991 | Hornbeck . |
| 5,083,857 | 1/1992 | Hornbeck . |
| 5,097,354 | 3/1992 | Goto . |
| 5,111,693 | 5/1992 | Greiff . |
| 5,126,812 | 6/1992 | Greiff . |
| 5,129,983 | 7/1992 | Greiff . |
| 5,172,262 | 12/1992 | Hornbeck . |
| 5,179,499 | 1/1993 | MacDonald et al. . |
| 5,184,269 | 2/1993 | Shimada et al. . |
| 5,202,785 | 4/1993 | Nelson . |
| 5,203,208 | 4/1993 | Bernstein . |
| 5,212,582 | 5/1993 | Nelson . |
| 5,216,490 | 6/1993 | Greiff et al. . |
| 5,233,459 | 8/1993 | Bozler et al. . |
| 5,258,591 | 11/1993 | Buck . |
| 5,260,596 | 11/1993 | Dunn et al. . |
| 5,268,696 | 12/1993 | Buck et al. . |
| 5,274,379 | 12/1993 | Carbonneau et al. . |
| 5,309,056 | 5/1994 | Culp . |
| 5,311,360 | 5/1994 | Bloom et al. . |
| 5,331,852 | 7/1994 | Greiff et al. . |
| 5,349,855 | 9/1994 | Bernstein et al. . |
| 5,353,656 | 10/1994 | Hawkey et al. . |
| 5,355,712 | 10/1994 | Petersen et al. . |
| 5,367,136 | 11/1994 | Buck . |
| 5,367,584 | 11/1994 | Ghezzo et al. . |
| 5,392,650 | 2/1995 | O'Brien et al. . |
| 5,408,355 | 4/1995 | Rauch et al. . |
| 5,408,877 | 4/1995 | Greiff et al. . |
| 5,438,231 | 8/1995 | Khoshnevisan et al. . |
| 5,450,751 | 9/1995 | Putty et al. . |
| 5,463,233 | 10/1995 | Norling . |
| 5,465,620 | 11/1995 | Sanderson et al. . |
| 5,467,068 | 11/1995 | Field et al. . |
| 5,475,318 | 12/1995 | Marcus et al. . |
| 5,488,862 | 2/1996 | Neukermans et al. . |
| 5,488,863 | 2/1996 | Mochida et al. . |
| 5,492,596 | 2/1996 | Cho . |
| 5,496,436 | 3/1996 | Bernstein et al. . |
| 5,507,911 | 4/1996 | Greiff . |
| 5,515,724 | 5/1996 | Greiff et al. . |
| 5,530,342 | 6/1996 | Murphy . |
| 5,535,902 | 7/1996 | Greiff . |
| 5,536,988 | 7/1996 | Zhang et al. . |
| 5,552,925 | 9/1996 | Worley . |
| 5,558,304 | 9/1996 | Adams . |
| 5,568,307 | 10/1996 | Williams . |
| 5,578,976 | 11/1996 | Yao . |
| 5,583,507 | 12/1996 | D'Isepo et al. . |
| 5,600,174 | 2/1997 | Reay et al. . |
| 5,602,955 | 2/1997 | Haake . |
| 5,606,447 | 2/1997 | Asada et al. . |
| 5,606,635 | 2/1997 | Haake . |
| 5,616,864 | 4/1997 | Johnson et al. . |
| 5,629,565 | 5/1997 | Schlaak et al. . |
| 5,629,665 | 5/1997 | Kaufmann et al. . |
| 5,629,790 | 5/1997 | Neukermans et al. . |
| 5,635,638 | 6/1997 | Geen . |
| 5,635,639 | 6/1997 | Greiff et al. . |
| 5,635,640 | 6/1997 | Geen . |
| 5,635,739 | 6/1997 | Grieff et al. . |
| 5,644,177 | 7/1997 | Guckel et al. . |
| 5,646,348 | 7/1997 | Greiff et al. . |
| 5,650,568 | 7/1997 | Greiff et al. . |
| 5,652,374 | 7/1997 | Chia et al. . |
| 5,656,777 | 8/1997 | Petri et al. . |
| 5,656,778 | 8/1997 | Roszhart . |
| 5,658,698 | 8/1997 | Yagi et al. . |
| 5,659,285 | 8/1997 | Takeda . |
| 5,661,592 | 8/1997 | Bornstein et al. . |
| 5,673,139 | 9/1997 | Johnson . |
| 5,722,989 | 3/1998 | Fitch et al. . |
| 5,745,281 * | 4/1998 | Yi et al. .............................. 359/290 |
| 5,757,562 | 5/1998 | Apollonov et al. . |
| 5,781,331 * | 7/1998 | Carr et al. ........................... 359/291 |
| 5,796,152 | 8/1998 | Carr et al. . |
| 5,813,441 | 9/1998 | Dewispelaere . |
| 5,818,683 | 10/1998 | Fujii . |
| 5,862,003 | 1/1999 | Saif et al. . |
| 5,870,518 | 2/1999 | Haake et al. . |
| 5,881,198 | 3/1999 | Haake . |
| 5,909,078 | 6/1999 | Wood et al. . |
| 5,955,817 | 9/1999 | Dhuler et al. . |
| 5,962,949 | 10/1999 | Dhuler et al. . |
| 6,140,794 * | 11/2000 | Mao et al. ........................... 385/140 |
| 6,148,124 * | 11/2000 | Aksyuk et al. ...................... 385/24 |
| 6,163,643 * | 12/2000 | Bergmann et al. .................. 385/140 |
| 6,173,105 * | 1/2001 | Aksyuk et al. ...................... 385/140 |

FOREIGN PATENT DOCUMENTS

| | | |
|---|---|---|
| 0 478 956 A3 | 4/1992 | (EP) . |
| 0 657 760 A1 | 6/1995 | (EP) . |
| 0 665 590 A2 | 8/1995 | (EP) . |
| 0 834 759 A2 | 4/1998 | (EP) . |
| 792145 | 3/1958 | (GB) . |
| 2 123 248 | 1/1984 | (GB) . |
| 601771 | 4/1978 | (RU) . |
| WO 89/09477 A1 | 10/1989 | (WO) . |
| WO 94/19819 A1 | 9/1994 | (WO) . |
| WO 95/03562 A1 | 2/1995 | (WO) . |
| WO 95/23352 A1 | 8/1995 | (WO) . |
| WO 99/24783 A1 | 5/1999 | (WO) . |

OTHER PUBLICATIONS

A Silicon Optical Modulator With 5 MHz Operation For Fiber–In–The–Loop Applications, J. A. Walker, et al., The 8th International Conference on Solid–State Sensors and Actuators, and Eurosensors IX, Jun. 1995, pp. 285–288.

Applications for Surface–Micromachined Polysilicon Thermal Actuators and Arrays, J. H. Comtois et al., Sensors and Actuators, vol. 58, No. 1, Jan. 1997, pp. 19–25.

Deformable Grating light Valves for High Resolution Displays, R. B. Apte et al., Solid–State Sensor and Actuator Workshop, Jun. 1994, pp. 1–6.

Design And Development of Microswitches For Micro–Electro–Mechanical Relay Matrices, M. W. Phipps, Thesis, Air Force Inst. of Tech., Wright–Patterson AFB, OH School of Engineering, 1995.

Design of Integrated MEMs, B. E. Boser et al., Emerging Technologies, Designing Low Power Digital Systems, pp. 207–232, 1996.

Developing Infrastructure to Mass–Produce MEMS, K. W. Markus, IEEE Computational Science & Engineering, Jan.–Mar. 1997, pp. 49–54.

Development of Micro–Electro–Mechanical Optical Scanner, M. E. Motamedi et al., Opt. Eng. 36(5), May 1997, pp. 1346–1352.

Dry–Released Process for Aluminum Electrostatic Actuators, C. W. Storment et al., Solid–State Sensor and Actuator Workshop, Jun. 1994, pp. 95–98.

Electromagnetic Microactuators With Multiple Degrees of Freedom, B. Wagner et al., IEEE, 1991, pp. 614–617.

Electrostatic Micromechanic Actuators, U. Breng et al., J. Micromech. Microeng. 2 (1992) pp. 256–261.

Fabrication Of SOI Wafers With Buried Cavities Using Silicon Fusion Bonding And Electrochemical Etchback, J. M. Noworolski et al., Transducers '95—Eurosensors IX, The 8th International Conference On Solid State Sensors and Actuators, and Eurosensors IX, Stockholm, Sweden, Jun. 25–29, 1995, pp. 71–74.

Integrable Active Microvalve With Surface Micromachined Curled–Up Actuator, J. Haji–Babaer et al., 1997 International Conference on Solid–State Sensors and Actuators, Jun. 1997, pp. 833–836.

Large Aperture Stark Modulated Retroreflector at 10.8 $\mu$m, M. B. Klein et al., J. Appl. Phys. 51(12), Dec. 1980, pp. 6101–6104.

Magnetically Actuated Micromirrors for Fiber–Optic Switching, B. Behin, Solid–State Sensor and Actuator Workshop, Jun. 1998, pp. 273–276.

MEMS Infrastructure: Multi–User Access and Smart MEMS, K. W. Markus et al., 1994 Digest of Papers, pp. 207–210.

Micromachined Corner Cube Reflectors as a Communication Link, D. S. Gunawan et al., Sensors and Actuators A—Physical A47(1995) pp. 580–583.

Microwave Reflection Properties of a Rotating Corrugated Metallic Plate Used as a Reflection Modulator, G. E. Peckham et al., IEEE Transactions on Antennas and Propagation, vol. 36, No. 7, Jul. 1988, pp. 1000–1006.

Multimode Digital Control of a Suspended Polysilicon Microstructure, G. K. Fedder et al., Journal of Microelectromechanical Systems, vol. 5, No. 4, Dec. 1996, pp. 283–297.

Optical Microshutters and Torsional Micromirrors for Light Modulator Arrays, V. P. Jaecklin et al., IEEE, 1993, pp. 124–127.

Semiconducting Stress Transducers Utilizing the Transverse and Shear Piezoresistance Effects, W. G. Pfann et al., The Journal of Applied Physics, vol. 32, No. 10, Oct. 1961, pp. 2008–2019.

Silicon As a Mechanical Material, K. E. Petersen, Proceedings of the IEEE, vol. 70, No. 5, May 1982, pp. 420–457.

Silicon Fusion Bonding And Deep Reactive Ion Etching: A New Technology For Microstructures, E. H. Klaassen et al., Sensors And Actuators A, vol. 52, 1996, pp. 132–139.

Silicon Fusion Bonding And Deep Reactive Ion Etching: A New Technology for Microstructures, E. H. Klassen et al., Transducers '95—Eurosensors IX, The 8th International Conference on Solid State Sensors And Actuators, and Eurosensors IX, Stockholm, Sweden, Jun. 25–29, 1995, pp. 556–559.

Silicon–Microactuators: Activation Mechanisms and Scaling Problems, W. Benecke, IEEE 1991, pp. 46–49.

Silicon Torsional Scanning Mirror, K. E. Petersen, IBM J. Res. Develop., vol. 24, No. 5, Sep. 1980, pp. 631–637.

Single Crystal Silicon Actuators And Sensors Based On Silicon Fusion Bonding Technology, Semi–Annual Progress Report 1, Advanced Research Projects Agency, Lucas NovaSensor, Contract No. DAL 01–94–C–3411, Apr.–Jul. 1994.

Single Crystal Silicon Actuators And Sensors Based On Silicon Fusion Bonding Technology, Semi–Annual Progress Report 2, Advanced Research Projects Agency, Lucas NovaSensor, Contract No. DAL 01–94–C–3411, Jul., 1994–Jan. 1995.

Single Crystal Silicon Actuators And Sensors Based On Silicon Fusion Bonding Technology, Semi–Annual Progress Report, Advanced Research Projects Agency, Lucas NovaSensor, Contract No. DAL 01–94–C–3411, Jan.–Jul. 1995.

Single Crystal Silicon Actuators And Sensors Based On Silicon Fusion Bonding Technology, Semi–Annual Progress Report, Advanced Research Projects Agency, Lucas NovaSensor, Contract No. DAL 01–94–C–3411, Jan.–Aug. 1996.

Single–Crystal Silicon High–Q Torsional Oscillators, R. N. Kleiman et al., Rev. Sci. Instrum. 56(11), Nov. 1985, pp. 2088–2091.

Smart MEMS: Flip Chip Integration of MEMS and Electronics, K. W. Markus et al., Smart Structures and Materials 1995—Smart Electronics, Proceedings of SPIE The International Society of Optical Engineering, vol. 2448, Varadan ed. Mar. 2–3, 1995, pp. 82–92.

SOI (Simox) and Substrate for Surface Micromachining of Single Crystalline Silicon Sensors and Actuators, B. Diem et al., The 7th International Conference on Solid–State Sensors and Actuators, 1994, pp. 233–236.

Surface–Micromachined Free–Space Fiber Optic Switches With Integrated Microactuators for Optical Fiber Communication Systems, S. Lee et al., UCLA, 4 pages.

Surface Micromachined Linear Thermal Microactuator, J. W. Judy et al., International Electron Devices Meeting 1990, Technical Digest (Cat No. 90CH2865–4, Dec. 1990, pp. 629–632, New York, New York.

Surface Micromachined Polysilicon Thermal Actuator Arrays and Applications, J. H. Comtois et al., Solid–State Sensor and Actuator Workshop, Jun. 1996, pp. 174–177.

Surface Micromachined Structures Fabricated With Silicon Fusion Bonding, K. Petersen et al., 1991 International Conference on Solid–State Sensors and Actuators, Digest of Technical Papers, 1991, pp. 397–399.

The Development of Polysilicon Micromotors for Optical Scanning Applications, K. Deng et al., Case Western Reserve University, 5 pages.

The Properties of Electrodeposited Metals & Alloys, W. H. Safranek, Amer. Electroplaters & Surface Finishers Society, 1986, pp. 295–315.

Thin Film Heater on A Thermally Isolated Microstructure, S. Oh et al., Mat. Res. Soc. Symp. Proc. vol. 276, 1992, Materials Research Society, pp. 277–282.

2–Dimensional Optical Scanner Applying A Torsional Resonator With 2 Degrees of Freedom, Y. Ohtuka et al., Proceedings, IEEE Micro Electro Mechanical Systems, 1995, pp. 306–309.

Vertically Driven Microactuators by Electrothermal Buckling Effects, L. Lin et al., Sensors and Actuators, Nov. 1998, vol. 71, No. 1–2, pp. 35–39.

Very High Q–factor Resonators in Monocrystalline Silicon, R. A. Buser et al., Sensors and Actuators, A21–A23 (1990) pp. 323–327.

* cited by examiner

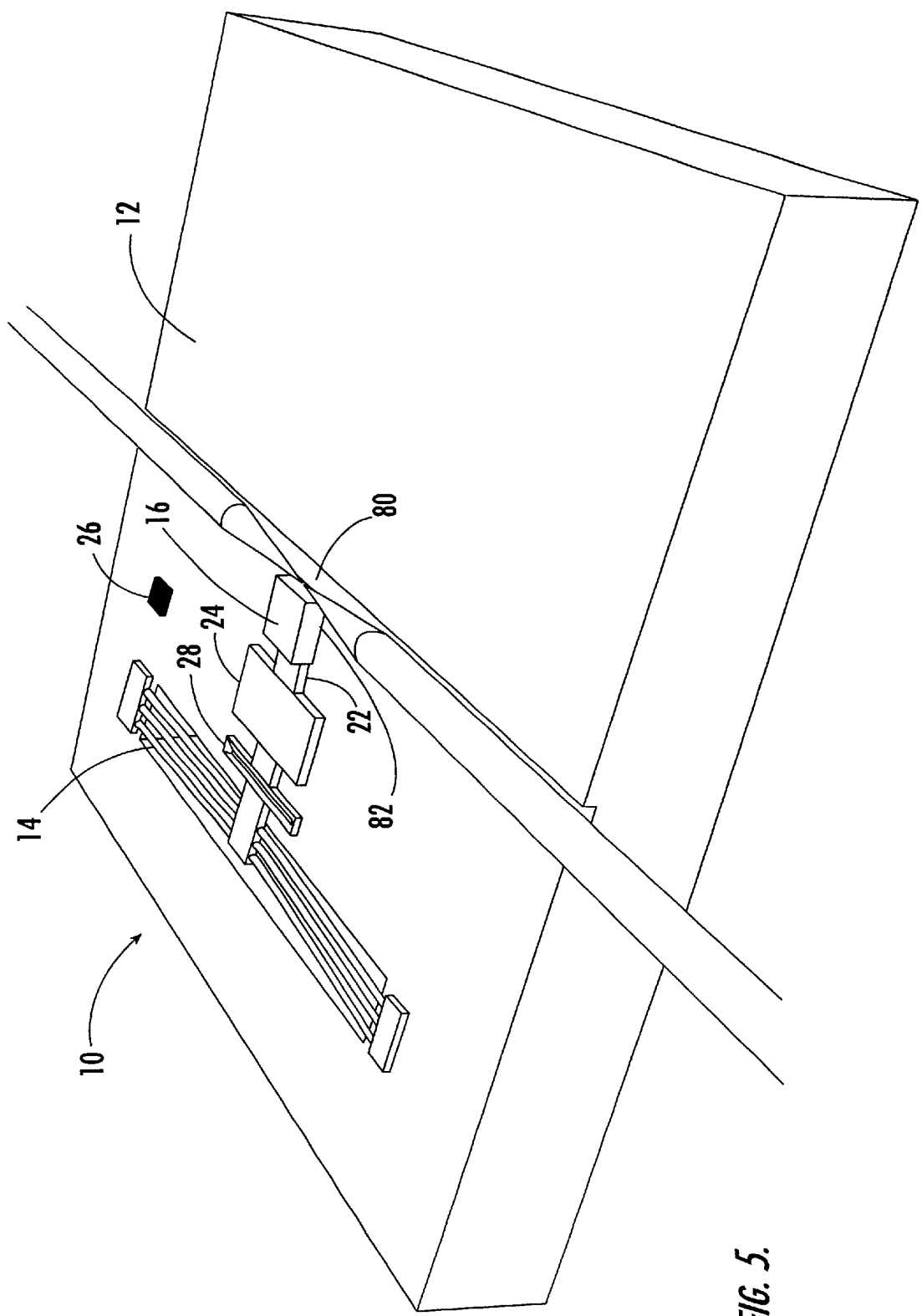

MEMS VARIABLE OPTICAL ATTENUATOR

FIELD OF THE INVENTION

The present invention relates to microelectromechanical optical attenuator structures, and more particularly to variably controlled, microelectromechanically actuated, optical attenuators and methods of fabricating such structures.

BACKGROUND OF THE INVENTION

Advances in thin film technology have enabled the development of sophisticated integrated circuits. This advanced semiconductor technology has also been leveraged to create MEMS (Micro Electro Mechanical System) structures. MEMS structures are typically capable of motion or applying force. Many different varieties of MEMS devices have been created, including microsensors, microgears, micromotors, and other microengineered devices. These MEMS devices can be employed in a variety of applications including hydraulic applications in which pumps and valves are used and optical applications that include MEMS light valves and shutters. Currently, MEMS devices are being developed for a wide variety of applications because they provide the advantages of low cost, high reliability and extremely small size.

Design freedom afforded to engineers of MEMS devices has led to the development of various techniques and structures for providing the force necessary to cause the desired motion within microstructures. For example, microcantilevers have been used to apply rotational mechanical force to rotate micromachined springs and gears. Electromagnetic fields have been used to drive micromotors. Piezoelectric forces have also successfully been used to controllably move micromachined structures. Controlled thermal expansion of actuators or other MEMS components has been used to create forces for driving microdevices. One such device is found in U.S. Pat. No. 5,475,318 entitled "Microprobe" issued Dec. 12, 1995 in the name of inventors Marcus et al., which leverages thermal expansion to move a microdevice. A micro cantilever is constructed from materials having different thermal coefficients of expansion. When heated, the bimorph layers arch differently, causing the micro cantilever to move accordingly. A similar mechanism is used to activate a micromachined thermal switch as described in U.S. Pat. No. 5,463,233 entitled "Micromachined Thermal Switch" issued Oct. 31, 1995 in the name of inventor Norling.

In addition, U.S. Pat. No. 5,909,078 entitled "Thermal Arched Beam Microelectromechanical Actuators" which issued Jun. 1, 1999 in the name of inventors Wood, et al., describes thermal actuators having a pair of arched beams extending between a pair of supports disposed on a microelectronic substrate. By passing current through the arched beams, the arched beams will expand so as to further arch. The thermal actuator of the Wood patent can also include an actuator member that connects a plurality of arched beams and serves to push against a workpiece.

The need exists to develop MEMS actuated variable optical attenuators that will benefit from the low cost fabrication, high reliability and size advantage that are characteristic of similar MEMS structures. Of particular importance in optical attenuation is the need to fabricate devices that are variable over a full optical power range and benefit from low insertion loss. By providing a device capable of attenuating optical power across a much larger dynamic power range, it would be possible to attenuate beams that have a much wider optical beam and/or an unfocussed beam at the point of attenuation. Additionally, a MEMS actuated variable optical attenuator would provide for finer and more precise control over the optical attenuation allowing for the transmitted optical power to be dynamically altered as required by the specific application. It is also desirable to devise a MEMS actuated variable optical attenuator that would benefit from less power consumption. To date, however, MEMS activated variable optical attenuators are not available, at least not commercially, even though such MEMS variable optical attenuators will likely be instrumental in future light wave communication systems and optoelectronic systems.

SUMMARY OF THE INVENTION

The present invention provides for improved MEMS variable optical attenuator devices. Further, a method for using and a method for making the MEMS variable optical attenuators according to the present invention are provided.

A MEMS variable optical attenuator according to the present invention comprises a microelectronic substrate, a microelectronic actuator disposed on the substrate and an optical shutter disposed on the substrate. The optical shutter is actuated by the microelectronic actuator and is adapted to be held at various attenuation positions, each position blocking a different percentage of optical power. In attenuating optical signals in such a fashion, the variable optical attenuator of the present invention is capable of attenuating an optical beam across a full optical power range. Additionally, the variable optical attenuator of the present invention may comprise an electrostatic clamping element operably connected to the optical shutter. The clamping element provides for the optical shutter to be electrostatically clamped at a desired attenuation position with very low standby power being applied to the MEMS actuator. In one embodiment of the invention, the MEMS actuator comprises a thermal arched beam actuator.

In one embodiment of the MEMS variable optical attenuator according to the present invention, the MEMS actuator and the optical shutter lie in-plane with the substrate and attenuate an optical beam that is generally perpendicular to the substrate and passes through an opening in the substrate. In another embodiment of the present invention, the MEMS actuator and the optical shutter of the MEMS variable optical attenuator lie in-plane with the substrate and attenuate an optical beam that is generally parallel to the substrate.

Alternatively, another embodiment of the present invention provides for the MEMS actuator to lie in-plane with the substrate and the optical shutter to lie in a plane generally perpendicular to the substrate and attenuate an optical beam that is generally parallel to the surface of the substrate. In addition, the present invention may provide for the MEMS actuator and optical shutter to lie in plane with the substrate with the optical shutter being extended beyond the edge of the substrate upon activation thereof so as to attenuate optical beams lying in planes outside the periphery of the substrate.

In another embodiment of the present invention, the variable optical attenuator may comprise an array of MEMS actuators configured so as to provide the optical shutter with greater displacement distances. MEMS actuators configured in an array benefit from increases in force or distance. In this manner, the optical shutter is capable of attenuating optical beams having wider cross-sections or unfocussed optical beams. Additionally, variable optical attenuators can also have multiple MEMS actuators configured so as to actuate a central hub that provides force to levers operably connected to optical shutters. Such a rotary hub arrangement utilizes mechanical advantages to provide increased actuation displacements and greater attenuation range. Alternatively, the present invention may comprise more than one optical shutter actuated from more than one MEMS actuator in which the optical shutters converge at the optical beam to provide attenuation. In such an arrangement, the shutters may be shaped so as to allow for an operative seal to form amongst the adjoining optical shutters.

In yet another embodiment of the present invention, the variable optical attenuator may comprise a microelectronic substrate having a generally planar surface and a thermal bimorph cantilever structure comprised of at least two materials having different coefficients of thermal expansions. A portion of the thermal bimorph is affixed to the substrate and another portion is released from the substrate so that when thermal activation is applied to the bimorph structure the bimorph moves in a direction consistent with the material having the lower coefficient of expansion. The bimorph may be configured so as to intercept the path of optical beams lying in planes above the surface of the substrate or below the surface of the substrate.

The present invention is also embodied in a method for variable optical attenuation. The method comprises using the variable optical attenuator of the present invention by activating the MEMS actuator, which moves the optical shutter into the path of an optical beam until the desired optical power is achieved. Therefore, the clamping element can be activated to lock the optical shutter into place and the MEMS actuator can be deactivated to eliminate standby power consumption.

Additionally, the present invention comprises a method for fabricating variable optical attenuators. The method includes selecting an appropriate microelectronic substrate, forming a layer of oxide on the substrate, forming a layer of silicon on the substrate, defining the mechanical structure on the substrate which comprises a MEMS thermal arched beam actuator, a stress relieving spring, an actuator member and an optical shutter, releasing the portion of the silicon layer defining the arched beams of the MEMS actuator, the stress relieving spring and the actuator member, doping the silicon layer to provide conductivity and etching the backside of the substrate to provide an opening to the optical shutter. Additionally the method of fabrication may further comprise defining the mechanical structure of a clamping element within the silicon layer and releasing the clamping element from the surface of the substrate.

The MEMS variable optical attenuator of the present invention is capable of attenuating optical beams across a full range of optical power. By using MEMS actuators that are adept at providing precise and continuous control of displacement, the present invention is capable of attenuating an optical beam to a specific degree within the optical power range and to vary the degree of attenuation as the application dictates. Additionally, the invention provides for mechanisms that allow for the attenuation to occur across extensive areas, thereby, allowing for attenuation to occur outside the focal region of the optical beam or across wider cross-sectioned optical beams. The present invention also benefits from having a clamping device that provides for the optical shutter to be locked in place once the desired level of attenuation is achieved. The clamping element eliminates the need to continue supplying standby power to the MEMS actuator during attenuation. As such, MEMS variable optical attenuators that have these improved performance characteristics, and many others that will be readily apparent to those of ordinary skill in the art, are desired for many optoelectronic and light wave communication applications.

BRIEF DESCRIPTION OF THE DRAWINGS

FIG. 5 is a perspective view of a MEMS variable optical attenuator providing in-plane actuation for use with optical beam having an axis parallel to the substrate in accordance with an embodiment of the present invention.

DETAILED DESCRIPTION OF THE INVENTION

The present invention now will be described more fully hereinafter with reference to the accompanying drawings, in which preferred embodiments of the invention are shown. This invention may, however, be embodied in many different forms and should not be construed as limited to the embodiments set forth herein; rather, these embodiments are provided so that this disclosure will be thorough and complete, and will fully convey the scope of the invention to those skilled in the art. Like numbers refer to like elements throughout.

Figure 1:
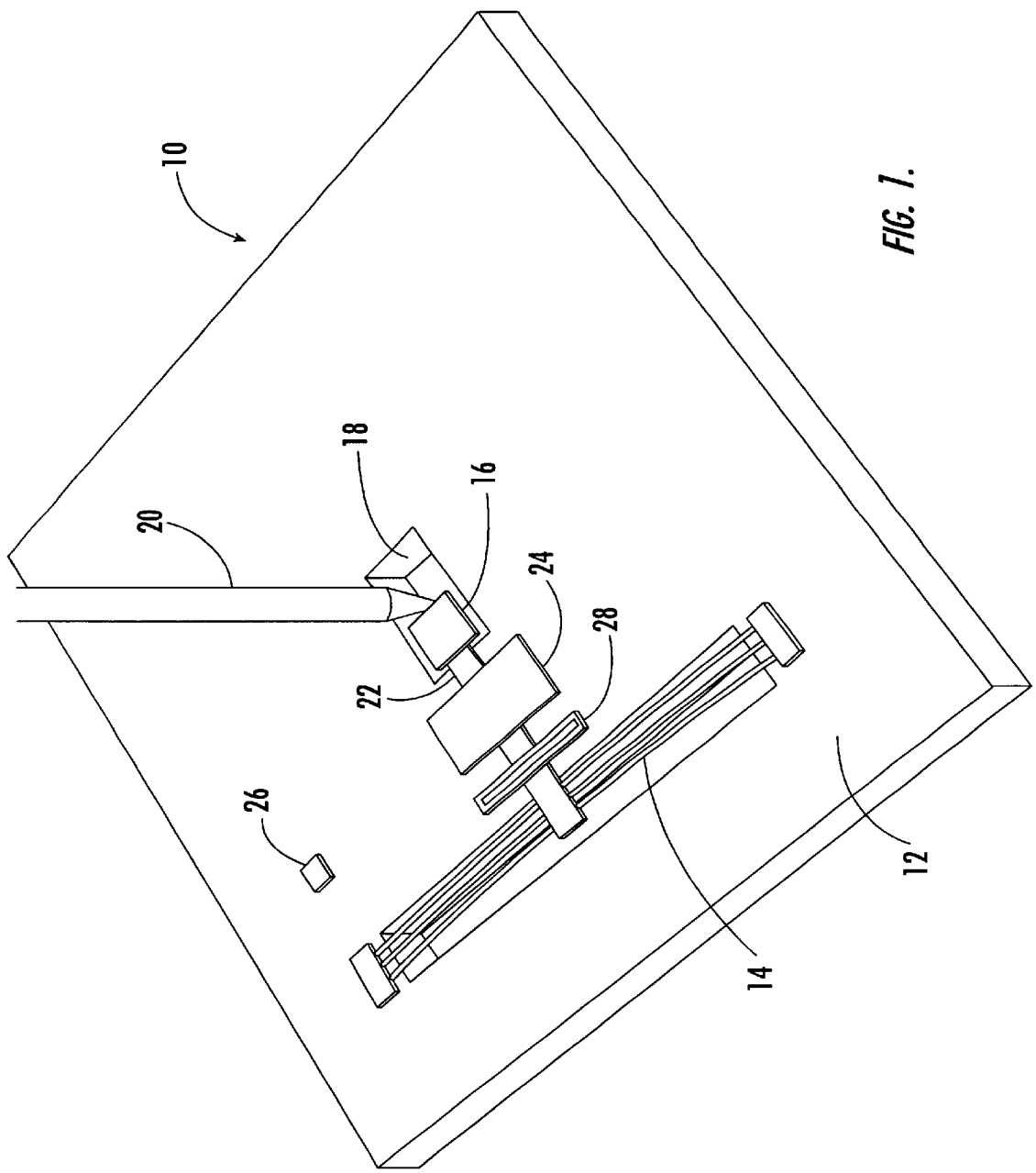
FIG. 1 is a perspective view of a MEMS variable optical attenuator providing in-plane actuation for use with an optical beam having an axis perpendicular to the substrate in accordance with an embodiment of the present invention.

Referring now to FIG. 1, a first embodiment of a Micro Electro Mechanical System (MEMS) variable optical attenuator 10 in accordance with the present invention is shown in a perspective view. As shown a MEMS variable optical attenuator includes a microelectronic substrate 12, a MEMS actuator 14, and an optical shutter 16. While the microelectronic substrate can comprise a variety of materials, the substrate is typically formed of silicon, quartz, glass or a polymeric material and preferably formed of silicon. The MEMS actuator serves as the mechanism that produces the forces propelling the displacement of the optical shutter. In this embodiment, the optical shutter may be displaced laterally in a plane parallel to the substrate so as to at least partially overlie an opening 18 defined by the substrate. This displacement of the shutter causes attenuation of the optical beam 20 that passes through the substrate opening. The precise and variable control provided by the MEMS actuator allows for the optical shutter to dynamically attenuate the optical beam over the entire optical power range or any other predetermined portion of the optical power range. As the optical shutter partially or fully blocks the optical beam, a change in the optical power that is incident on the receiving end of the optical system is observed. This allows the received optical power to be dynamically varied from 100% to 0% of the transmitted optical power. As shown, the optical shutter has a generally planar rectangular attenuation surface, however, the shape and the topography of the attenuation surface may be modified to provide the desired level of attenuation and minimize power consumption. By way of example, taller more block-like shutters may be constructed and shutters having openings to allow for beam passage may be feasible.

It should be noted that while the FIG. 1 embodiment shows an opening 18 in the microelectronic substrate 12 it is also possible to omit the opening in instances in which the microelectronic substrate comprises a transparent material, such as glass or quartz. The use of such transparent substrates in microelectronic applications is well known by those of skill in the art. The transparent nature of the substrate would allow for the optical beam to pass through thus, obviating the need for an opening in the substrate.

Figure 2:
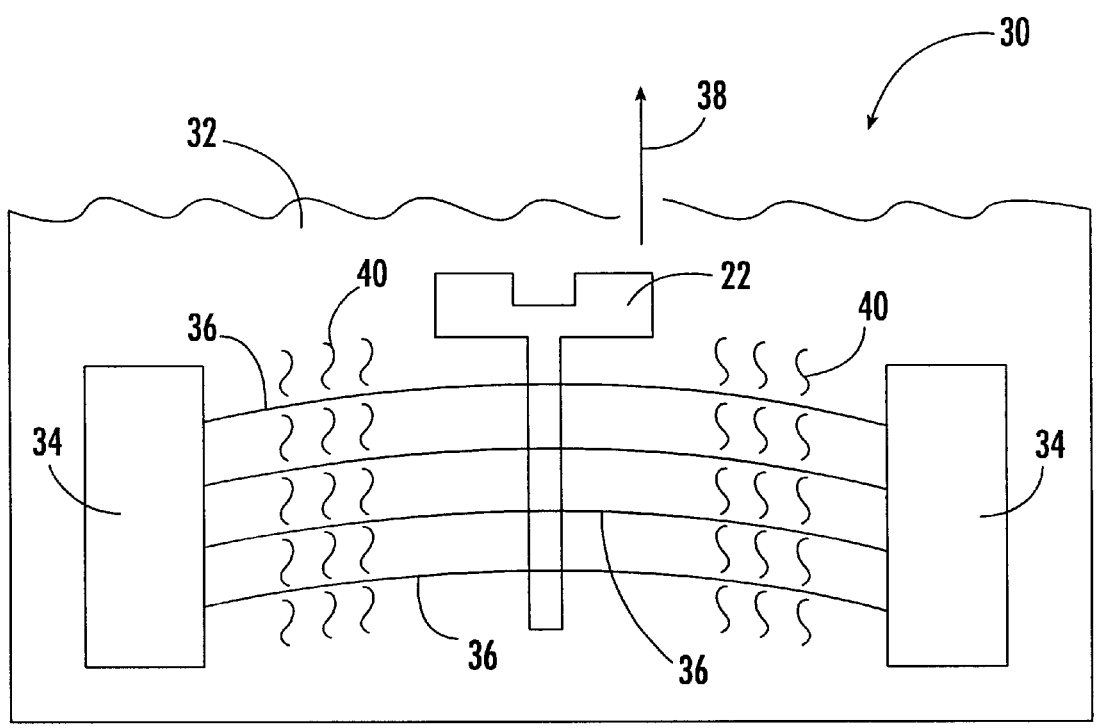
FIG. 2 is a top plan view of a MEMS thermal arched beam actuator as implemented in the present invention and in accordance with the prior art.

As illustrated in FIG. 1, a present embodiment of the invention may incorporate the use of a thermal arched beam actuator as the chosen MEMS actuator. In this embodiment the thermal arched beam actuator is shown by way of example only. Other MEMS actuators that impart necessary control and variability may also be used without departing from the inventive concepts herein disclosed. FIG. 2 depicts a top-view of a more detailed illustration of a thermal arched beam actuator. The thermal arch beam actuator 30 is formed on the generally planar surface 32 of a microelectronic substrate 12. Spaced apart supports 34 are formed on the surface of the substrate and arched beams 36 extend between the spaced apart supports. The number of arched beams that form the thermal arched beam actuator is shown by way of example, other thermal arched beam actuators having more or less arched beams are also feasible. The ends of the arched beams are affixed to the supports so that the arched beams are held in place above the surface of the substrate. The number of arched beams shown is by way of example, a single arch beam may be employed or larger numbers of arched beams may be used. One pair of supports (as shown in FIG. 2) may support multiple arched beams or they may be supported individually by isolated pairs of supports. The arched beams can be fabricated of a metal, such as a nickel, doped silicon, or another conductor, which has a positive coefficient of thermal expansion, so that the arched beams expand upon application of heat thereto. Alternatively, the beam may also be created from material that has a negative coefficient of thermal expansion that contracts upon application of heat thereto. The supports, which serve as the attachment point for the arched beams connecting to the substrate, may also be formed from a metal, such as nickel, that is preferably deposited on the substrate by an electroplating process. As shown in FIG. 2, the arched beams are arched in a direction 38 that generally extends parallel to the planar surface of the substrate and serves to define the direction of the displacement. An actuator member 22 serves as a mechanical coupler for the plurality of arched beams and upon heat being applied to the arched beams, the actuator member is displaced along the plane parallel to the planar surface of the substrate. Coupling the arched beams together can provide a stiffening affect that affords even higher degrees of force (i.e. force multiplication) than would be available from individual, uncoupled arched beams.

As shown in FIG. 2, the thermal arched beam actuator 30 also comprises means 40 for applying heat to the arched beam. The applied heat causes further arching of the arched beams 36 as a result of thermal expansion or contraction thereof. By having relatively high aspect ratios, the arched beams permit motion in the plane of direction 38, but are stiff and unrelenting outside the plane of direction. The further arching occurs along a predetermined direction and affects displacement of the arched beams and, in those embodiments having such, the actuator member. Various techniques can be used to apply heat to the thermal arched beams. For example, current may be applied directly through the arched beams. Alternatively, external heaters may be placed in close proximity to the arched beam structure or fluid/gas flow may be used to impart heat. Additionally, these techniques may be used in combination or other heating techniques may also be used.

Further discussion of thermal arched beam actuators is omitted from this description so as not to unnecessarily complicate the invention that is disclosed herein. For a more detailed discussion of thermal beam actuators see U.S. Pat. No. 5,909,078 entitled "Thermal Arched Beam Microelectromechanical Actuators" issued Jun. 1, 1999 in the name of inventors Wood et. al. and U.S. patent application Ser. No. 08/936,598 entitled "Thermal Arched Beam Microelectromechanical Devices and Associated Fabrication Methods" filed Sep. 24, 1997 in the name of inventors Dhuler et. al. The contents of this patent and patent application are hereby incorporated by reference as if fully setforth herein.

Referring once again to FIG. 1, the variable optical attenuator may comprise a clamping element 24 that serves as a means for holding the optical shutter at a prescribed attenuation position. In an embodiment having a thermal arched beam actuator, it is possible to actuate the optical shutter to the desired attenuation position, clamp the optical shutter in place by activating the clamping element and then remove current or other heat source driving the thermal arched beam actuator. Thus, the clamping element assists in further reducing the power requirements of the overall variable optical attenuator by eliminating the need for the actuator to maintain standby power. The clamping element may comprise an electrode for applying an electrostatic clampdown force to the shutter. A contact 26 is shown on the substrate and serves to electrically connect the clamping element to the substrate or to an additional electrode buried within the layered substrate structure. The voltage necessary to provide the clampdown action, typically in the range of 20 volts, may be supplied by an external voltage source. The clamping element and the contact may be fabricated from a nickel alloy, a silicon/gold composite or other electrically conductive materials. The clamping element, the arched beams 36 and the optical shutter 16 may be formed collectively during fabrication and released from the substrate by disposing a sacrificial release layer below the surface of the components.

As shown the clamping element may be physically attached or capable, upon activation, of being physically contacted by an actuator member 22. In the embodiment shown, the actuator member that is displaced by the MEMS actuator is physically attached to the optical shutter and, thus, clamping the actuator member serves to clamp the optical shutter. In other embodiments, in which the optical shutter is not physically attached to the actuator member or the actuator, it may be necessary to position the clamping element so that it is physically attached or capable, upon activation, of physically contacting the optical shutter.

Figure 3:
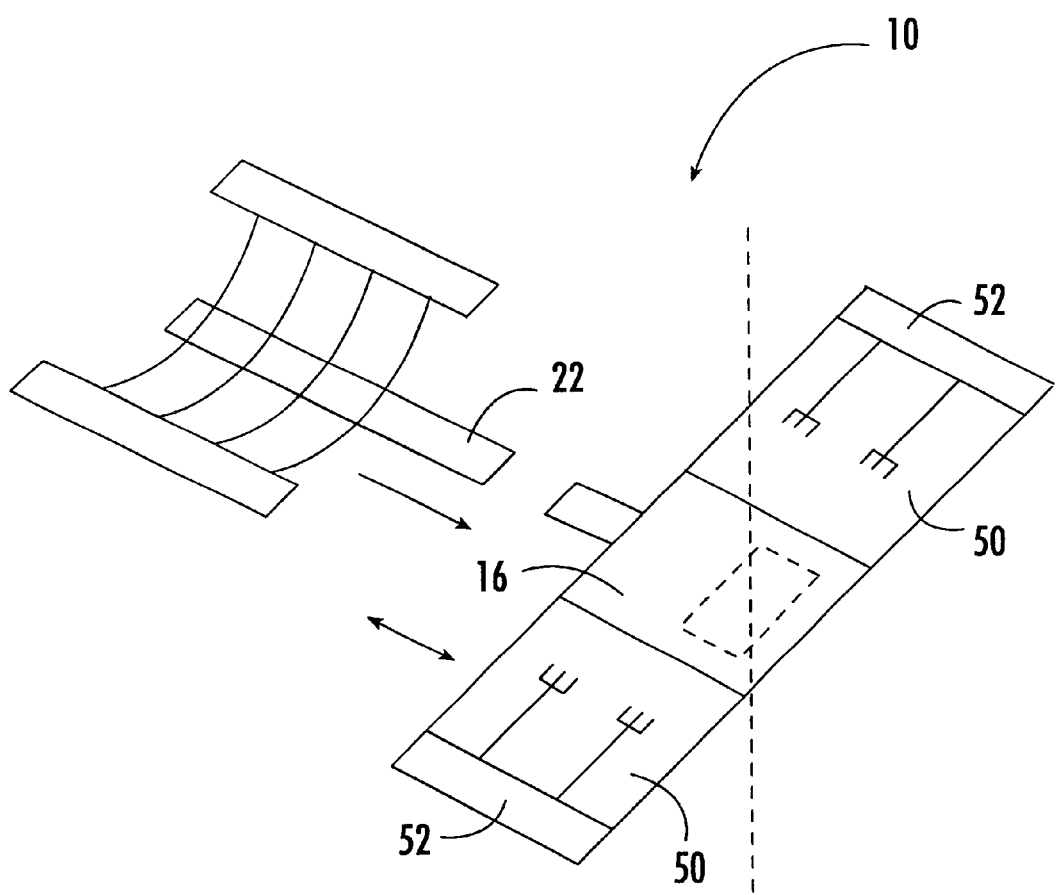
FIG. 3 is a perspective view of a MEMS variable optical attenuator having an actuator member physically disjoined from the optical shutter in accordance with an embodiment of the present invention.

Additionally, the actuator member 22 may be physically attached to the optical shutter, as shown in FIG. 1 or, alternatively, the optical shutter may be a separate entity only contacting the actuator member when propelled by the MEMS actuator. In instances where the actuator member is unattached to the optical shutter, the actuator member, upon being displaced, contacts the optical shutter to drive the shutter into the predetermined attenuation position. In this configuration the actuator member does not support the optical shutter above the substrate and, thus another means of support is necessary. FIG. 3 shows a perspective view of a variable optical attenuator 10 having an actuator member 22 that is not connected physically to the optical shutter 16. The optical shutter is supported above the microelectronic substrate 12 by a folded beam suspension system 50. The folded beam suspension system is affixed to the substrate through anchors 52 located at opposite ends of the suspension system. The suspension system operates to allow the optical shutter to move in the plane of desired displacement while supporting the optical shutter above the substrate. The use of such folded beam suspension systems is well known by those having ordinary skill in the art.

FIG. 1 also illustrates an optional stress relieving spring component 28 that may be disposed along the actuator member 22 between the MEMS actuator 14 and the clamping element 24. This spring component, which is not limited to the shape or configuration shown, is used in applications having a thermal arched beam actuator. The spring component provides a means for the arched beams to relax into their nominal state once the clamping element has been engaged and the source of thermal power is removed. In this regard, the stress relieving spring component is advantageous in releasing stress in the arched beams brought on by the continuous application of heat and subsequent cooling thereof. Additionally, the spring component aids in reducing the clamping force required to lock the optical shutter in place. By reducing the required clamping force less voltage needs to be applied to the clamping element.

Figure 4A:
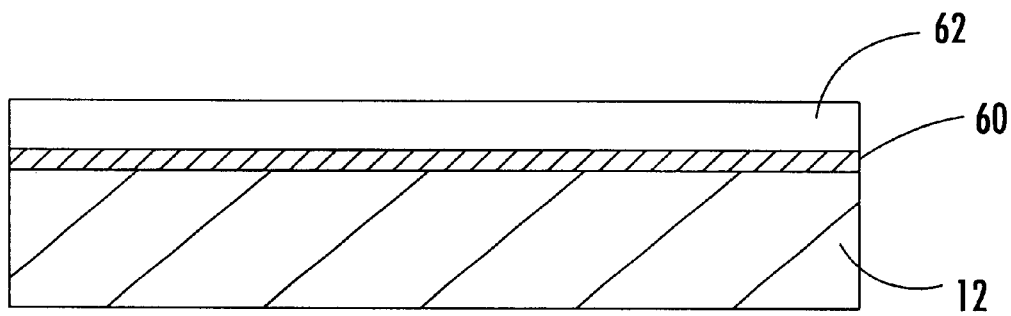
FIGS. 4A–4F are cross-sectional views of various stages in the fabrication process of the MEMS variable optical attenuator in accordance with an embodiment of the present invention.

FIGS. 4A–4G illustrate cross-sectional views of the variable optical attenuator during various stages of fabrication. The fabrication process shown in these figures and discussed herein is in accordance with a method of manufacturing the variable optical attenuator of the present invention from single crystal silicon. However, components of the variable optical attenuator can also be formed from other materials, such as nickel, and may utilize electroplating processes such as those described in the previously referenced U.S. patent application Ser. No. 08/936,598. It will also be understood by those having ordinary skill in the art that when a layer or component is described herein as "on" another layer or component, it may be formed directly on the layer, at the top, bottom or side surface area or one or more intervening layers may be provided between the layers. FIG. 4A depicts the initial microelectronic substrate construct comprising a substrate 12, an oxide layer 60 and a silicon layer 62. The substrate and the silicon layer will preferably be formed of single crystal silicon wafers. The substrate is typically about 400 microns thick and the silicon layer is polished back to typically about 60 microns, however, the substrates and the silicon layer can have other thicknesses if so desired. The oxide layer serves as a sacrificial layer for the later release of the clamping element, spring structure and thermal arched beam actuator. The construct shown in FIG. 4A may result from growing an oxide layer on the substrate or silicon layer and then using a conventional fusion bonding technique to bring the layers together. Alternatively, the silicon layer may be formed above the oxide layer by using a standard EPI process to grow the crystal. These fabrication processes are well known by those having ordinary skill in the art.

Figure 4B:
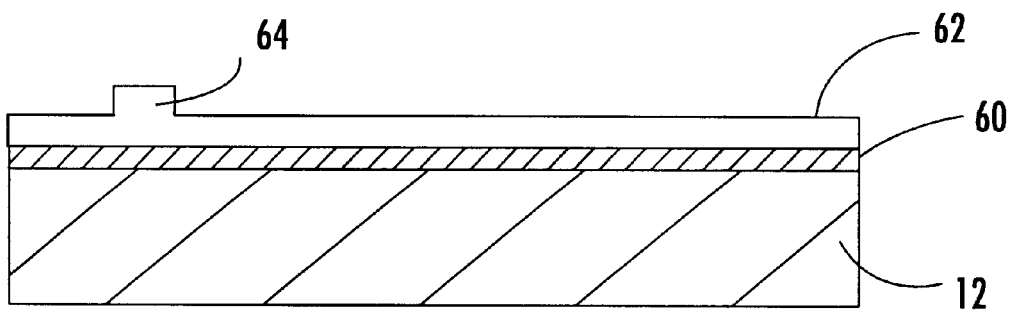

The next step, illustrated in FIG. 4B, details an optional process that is used to create a step-like structure 64 on the surface of the later defined optical shutter. This step-like structure adds thickness to the optical shutter and is advantageous in applications where the optical shutter is used to attenuate optical beams lying in the plane of the substrate or in a plane parallel to the substrate (detailed discussion of this embodiment follows). In these applications the sidewall surface of the optical shutter is used to attenuate the optical beam and, thus, in order to effectuate full power range attenuation a taller sidewall surface is desirable. In other applications the step-like structure may not be warranted, such as where the optical shutter is used to attenuate optical beams having planes perpendicular to the substrate. The step-like structure may be formed by depositing an oxide-masking layer above the surface of the silicon layer, preferably silicon dioxide disposed using standard deposition techniques. The oxide mask serves to define those areas on the silicon layer where the step-like structure is to be formed. A dry etch process is then used to remove the unpatterned oxide layer and a portion of the underlying silicon layer as a means of rendering the completed step-like structure shown in FIG. 4B.

Figure 4C:
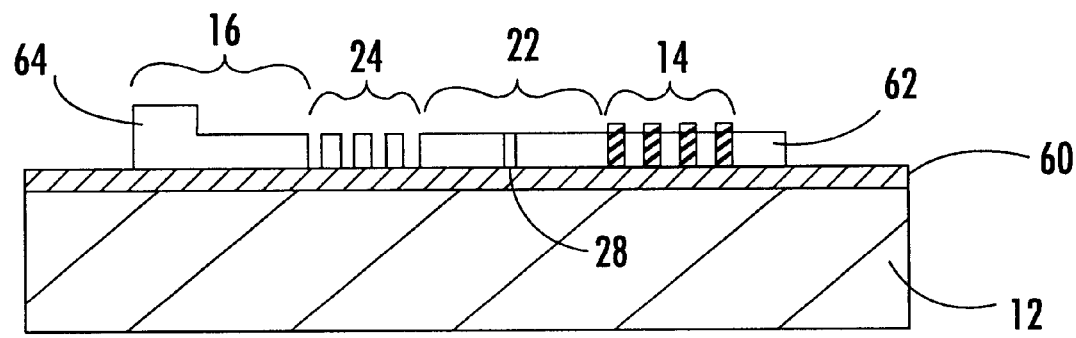

Referring to FIG. 4C, shown is an illustration of the variable optical attenuator construct after the silicon layer has been patterned with the mechanical structure of MEMS actuator 14, the optical shutter 16, the actuator member 22, the clamping element 24 and the stress relieving spring 28.

A mask is used to pattern the components and a dry etch process is used to remove regions of the silicon layer and define the requisite mechanical structure of the components. FIG. 4G, which illustrates a plan view of the variable optical attenuator details etch holes 66 formed in the surface of the clamping element 24 and the actuator member 22. The etch holes are patterned at this stage of the process and serve to facilitate the later release from the substrate of these components while insuring that the optical shutter 16 and the actuator supports 34 remain affixed to the surface of the substrate.

Figure 4D:
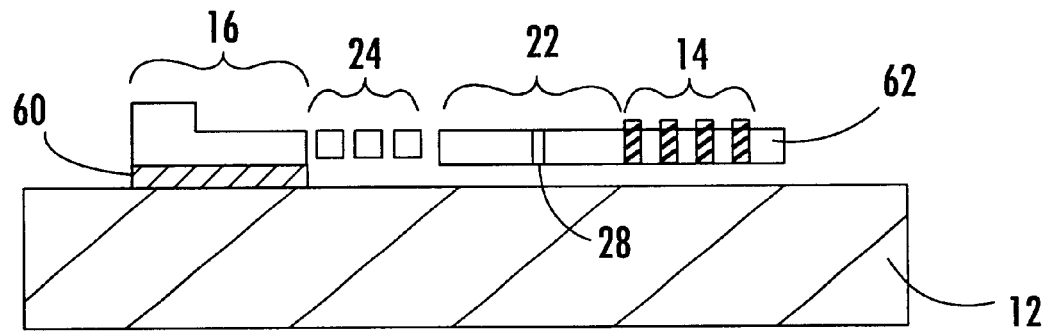

FIG. 4D shows the variable optical attenuator fabrication after the oxide layer 60 has been removed from beneath a portion of the attenuator construct to release those portions of the silicon layer comprising the MEMS actuator 14, the actuator member 22, the stress relieving spring 28 and the clamping element 24. A time dependant wet etch process is preferably used to remove the oxide layer and release the components of the attenuator. After the wet etch process, as shown in FIG. 4D, the oxide layer remains in most of the region underlying the optical shutter. Following the wet etch process the entire structure undergoes a doping process to impart conductivity to the structure in order to tailor resistance characteristics of the thermal arched beams, for example. Alternatively, the structure could undergo selective doping to insure conductivity to only those components requiring such.

Figure 4E:
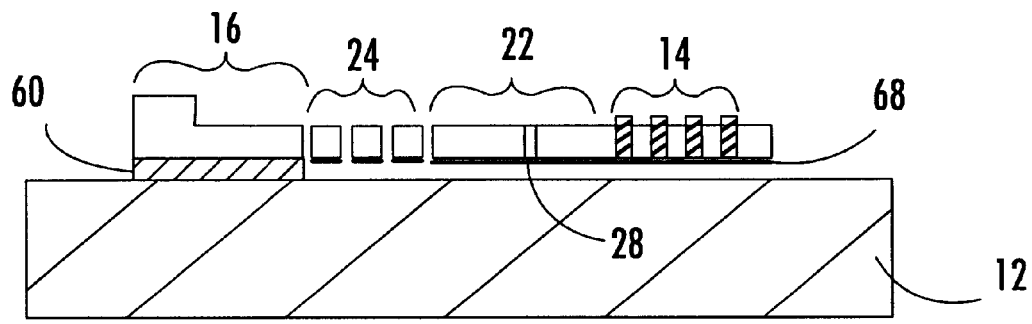

Referring to FIG. 4E, the variable optical attenuator is shown after an oxidation process has been performed and a dry etch process has been used to remove the oxide from the exposed regions. The oxide process is used to provide a dielectric layer 68 affixed to the underside of the clamping element and to provide for electrical insulation between the substrate and the clamping element. After the completion of the dry etch process, oxide remains on the underside and side walls of the clamping element, the actuator member, the stress relieving spring and the arched beams. The dry etch process serves to remove the oxide from the exposed, topside surfaces of the attenuator.

Figure 4F:
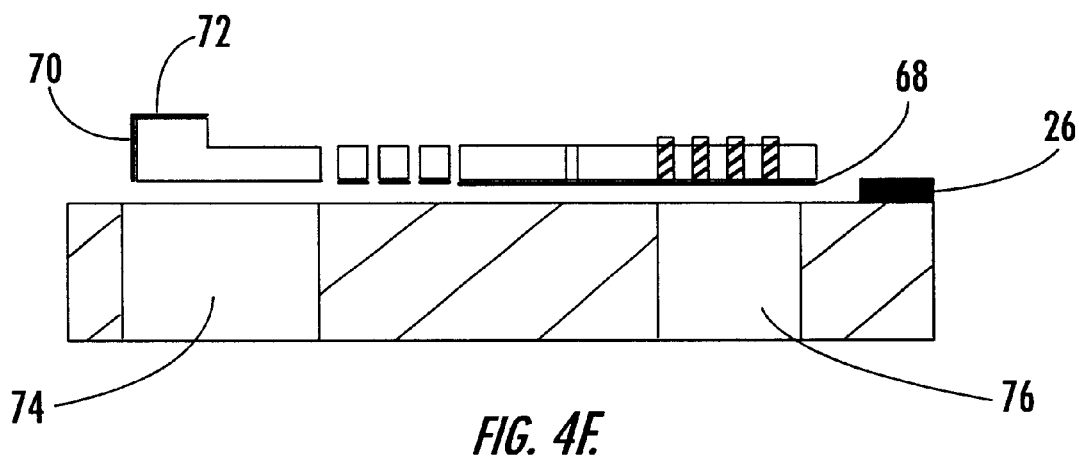
Figure 4G:
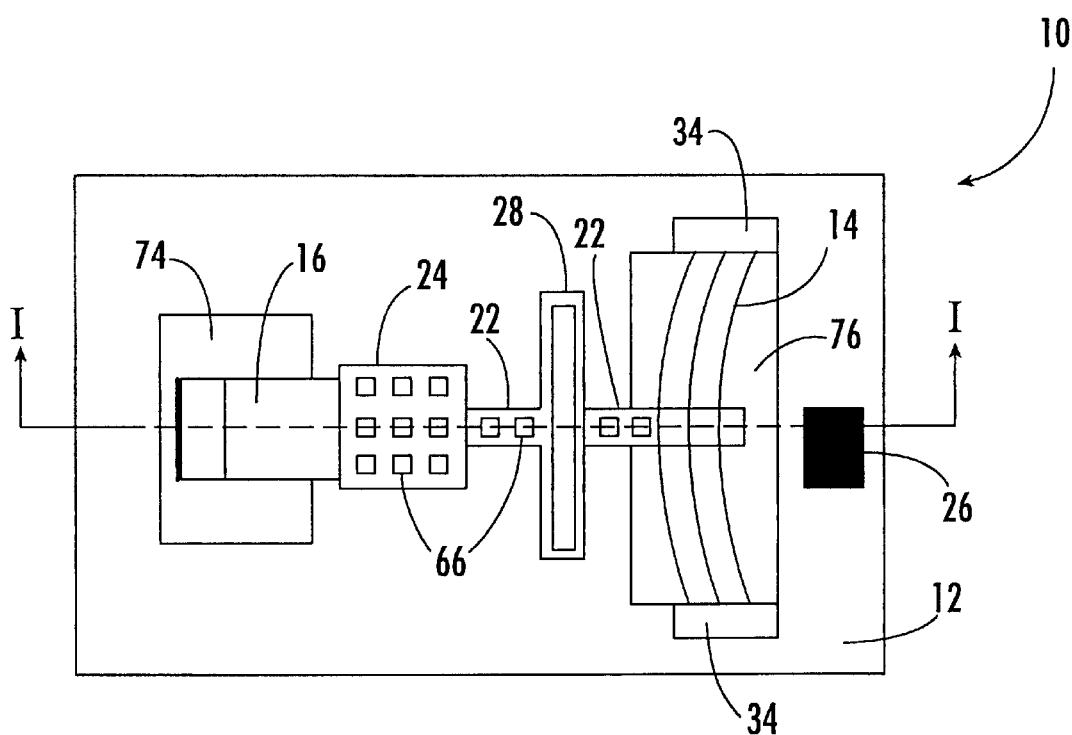
FIG. 4G is a plan view of a MEMS variable optical attenuator highlighting the deployment of etch holes in the top-side surfaces of the actuator member and the clamping element in accordance with an embodiment of the present invention.

The completed variable optical attenuator is depicted in FIG. 4F. In this illustration metalization has been patterned on the exposed sidewall 70 and topside 72 surfaces of the optical shutter to provide for a mirrored surface capable of optical beam deflection. The metalization on the optical mirror may comprise gold, nickel or another suitable metallic material. Additionally, a metal pad 26 is patterned on the surface of the substrate and serves as the contact/electrode for the clamping electrode. The variable optical attenuator is completed by backside etching through the substrate beneath the optical mirror a release opening 74 that allows for the optical mirror to be released from the surface of the substrate. An additional backside etch process may be used to create a second opening 76 in the substrate below the arched beams for the purpose of thermally isolating the arched beams.

In another embodiment of the present invention, FIG. 5 depicts a perspective view of a variable optical attenuator 10 that attenuates an optical beam lying in a plane generally parallel to the substrate. The MEMS actuator 14, preferably a thermal arched beam actuator, serves as the mechanism that produces the forces propelling the displacement of the optical shutter 16. The optical shutter is displaced laterally in a plane parallel to the microelectronic substrate 12. In this mode the optical shutter intersects a trench 80 lying in the substrate causing the optical shutter to attenuate an optical beam 20 that passes through the trench. In this embodiment a sidewall 82 of the shutter acts as the mechanism that blocks or attenuates the optical beam, thus, a taller optical shutter will provide for a larger area of attenuation. As described above, additional masking layers can be adding during the fabrication process of the optical shutter to produce a taller optical shutter. Additionally, this embodiment may include a clamping element 24 that provides the means to lock the optical shutter in at a desired attenuation position. A contact 26 is shown on the substrate and serves to establish an electrical force between the clamping element and the substrate or an additional electrode buried within the layered substrate structure. This embodiment of the invention benefits from less complicated optoelectronic packaging because unlike the embodiment in which the optical beam passes through an opening in the substrate, in this embodiment the chip can be mounted horizontally, as opposed to vertically, in the optoelectronic package.

Figure 6:
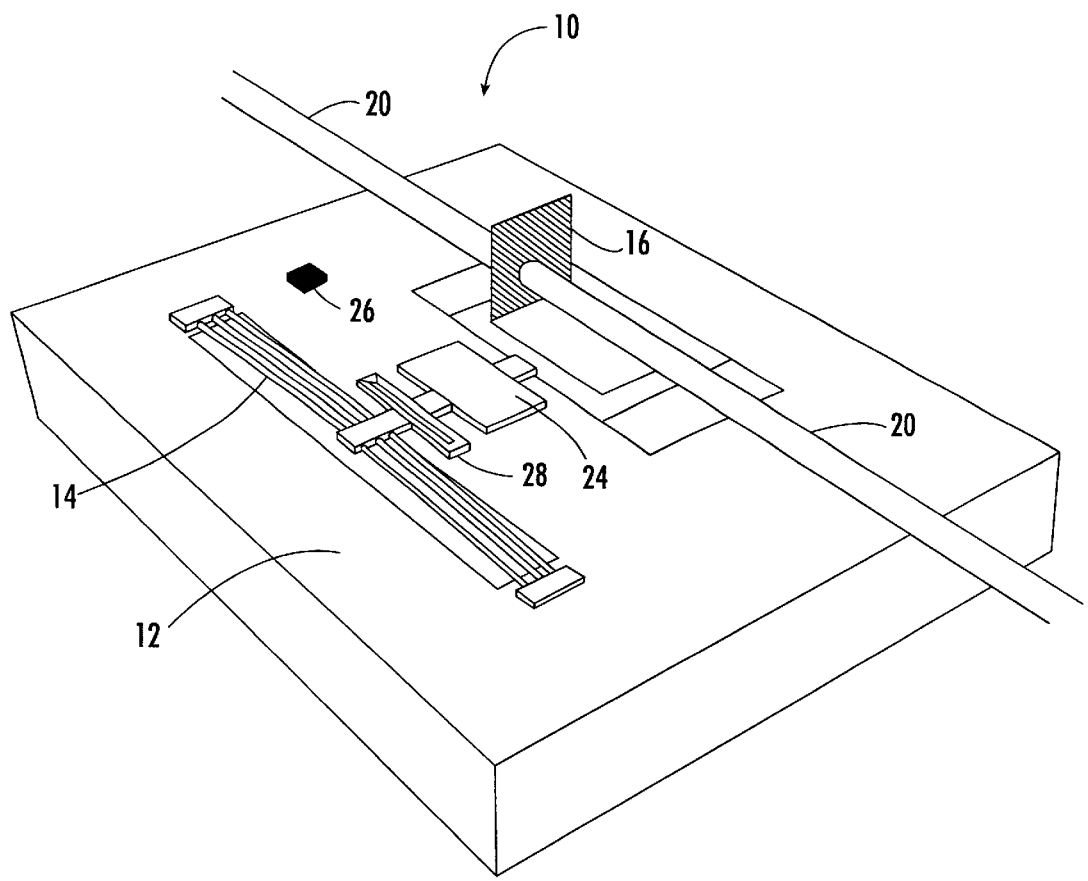
FIG. 6 is a perspective view of a MEMS variable optical attenuator providing out-of-plane attenuation for use with optical beam having an axis parallel to the substrate in accordance with an embodiment of the present invention.

Alternatively, as shown in FIG. 6 the present invention is represented in an embodiment of the variable optical attenuator 10 in which the MEMS actuator 14 lies in a plane generally parallel to the planar surface of the substrate 12 and the optical shutter 16 lies in a plane generally perpendicular to the planar surface of the microelectronic substrate. In this embodiment a pop-up optical shutter is fabricated as a step in the construction of the variable optical attenuator. A release or sacrificial layer is formed below the pop-up shutter layer allowing for the optical shutter to "pop-up" once the release layer is removed. A hinge type structure or flexible torsional support allows for the pop-up shutter to remain in a permanent vertical position. In this embodiment the optical shutter is displaced along a plane that is generally perpendicular to the surface of the substrate, as such, the optical shutter can attenuate an optical beam 20 that lies in a plane parallel to the substrate and travels in a path generally perpendicular to the direction of the actuator displacement. This configuration of the present invention allows for attenuation to occur without fabricating intricate openings or trenches in the surface of the substrate.

Figure 7:
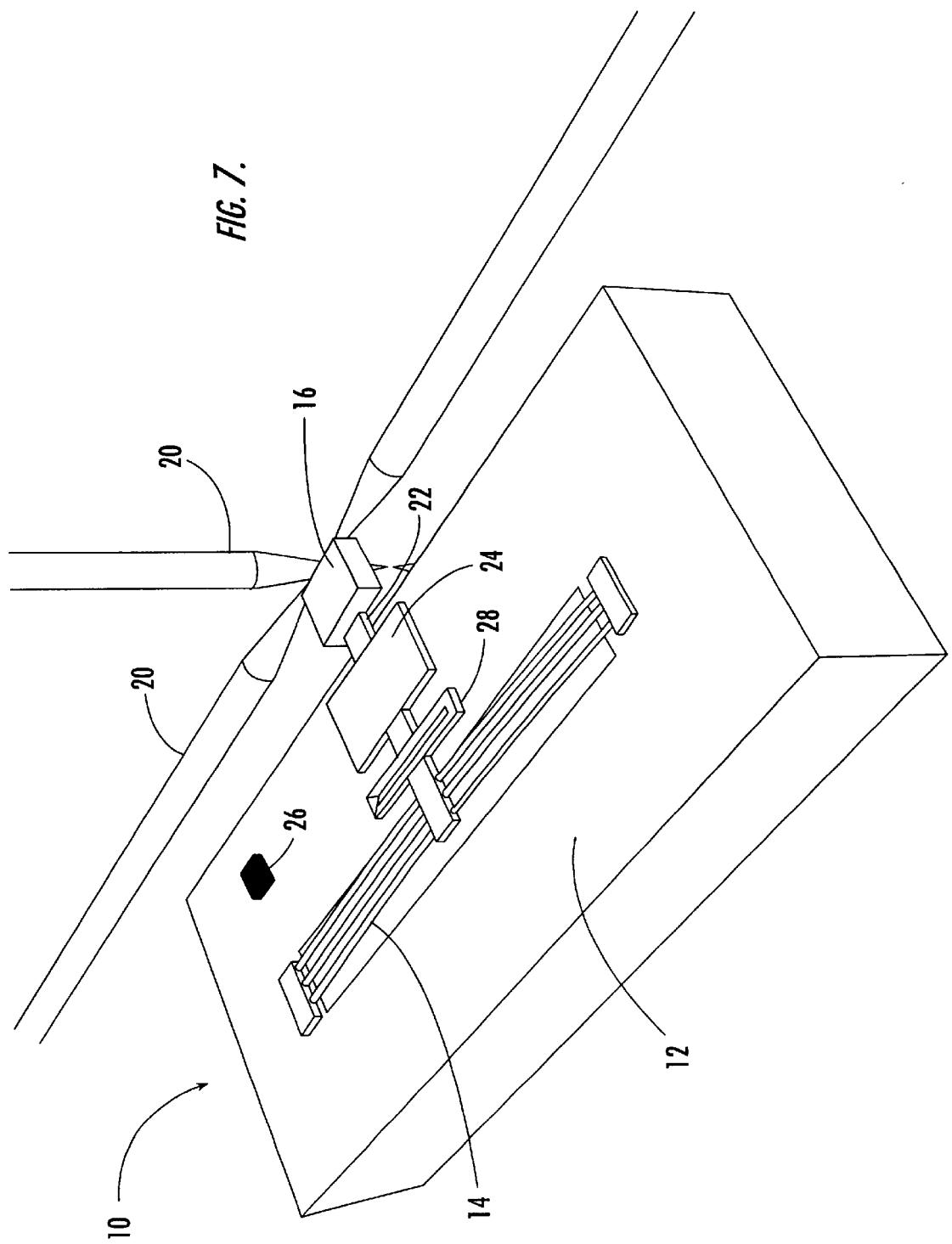
FIG. 7 is perspective view of a MEMS variable optical attenuator providing attenuation capabilities for use with optical beams having paths beyond the edge of the substrate in accordance with an alternate embodiment of the present invention.

FIG. 7 illustrates yet another embodiment of the present invention showing a perspective view of a variable optical attenuator 10 in which the optical shutter 16 lies over the edge of the microelectronic substrate 12 and blocks the passage of optical beams 20 that pass through planes outside the periphery of the microelectronic substrate. In this embodiment the MEMS actuator 14, preferably a thermal arched beam actuator, is physically attached to the optical shutter via the actuator member 22 and serves as the mechanism that produces the forces propelling the displacement of the optical shutter. The optical shutter is displaced laterally in a plane parallel to the microelectronic substrate and over an edge of the microelectronic substrate. In this embodiment the optical shutter is capable of attenuating optical beams that lie in planes both parallel and perpendicular to the plane in which the actuator and shutter lie. Additionally, the optical shutter is capable of attenuating optical beams lying in planes other than those parallel and perpendicular to the actuator and shutter construct. This embodiment of the invention benefits from a less complex fabrication because intricate openings and trenches in the microelectronic substrate are not warranted. Additionally, this embodiment lends itself to the use of smaller die size in fabricating the variable optical attenuator.

Figure 8:
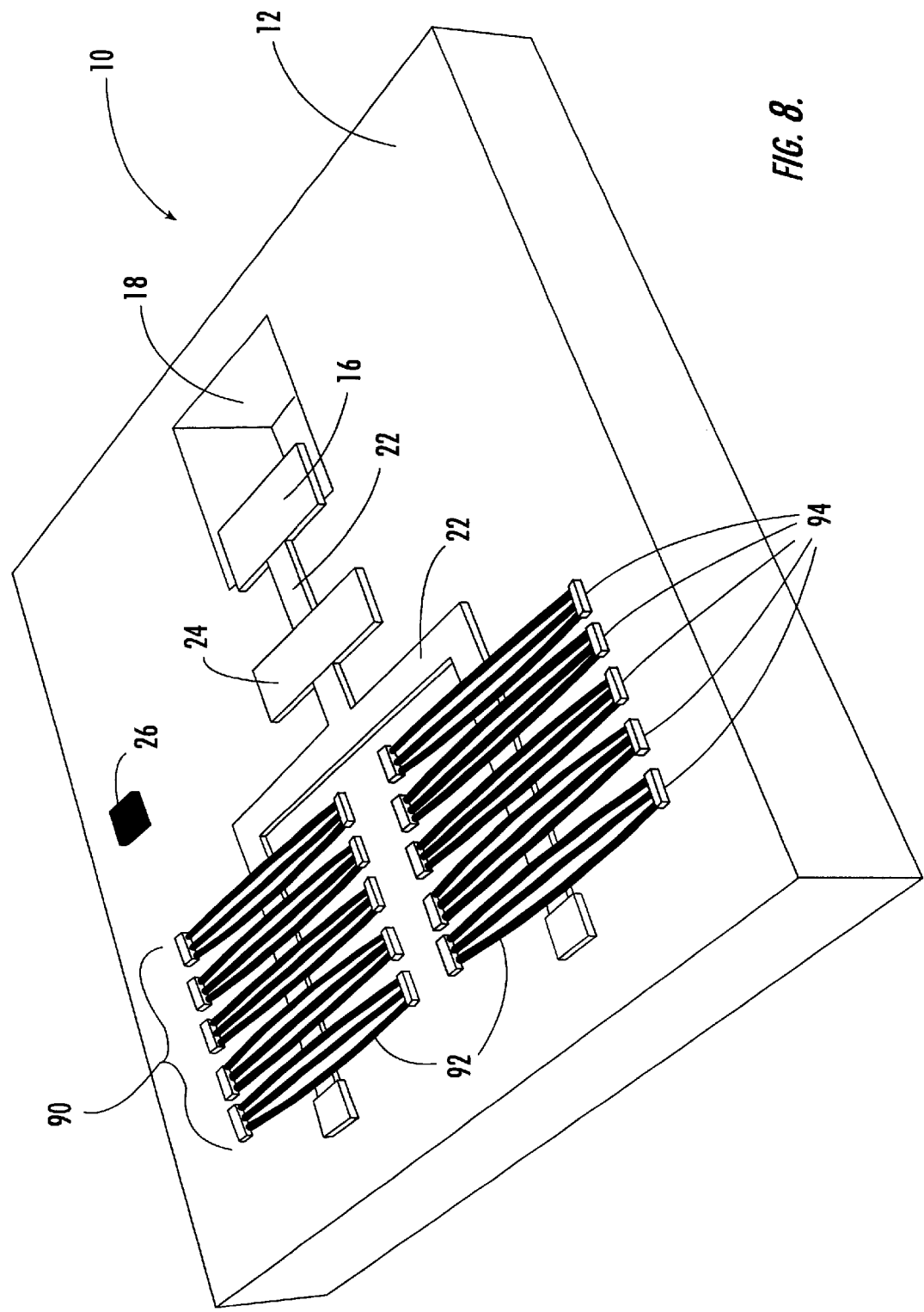
FIG. 8 is perspective view of a MEMS variable optical attenuator having a plurality of MEMS actuators defining an array in accordance with an alternate embodiment of the present invention.

In another embodiment of the present invention, FIG. 8 illustrates a variable optical attenuator 10 having a plurality of MEMS actuators assembled to define an array 90. As depicted the array of MEMS actuators comprises an array of thermal arched beam acuators. The use of thermal arched beam actuators is shown by way of example, it also possible and within the inventive concept herein disclosed to configure an array with other MEMS actuators that provide the necessary variability and precision needed to control the attenuator. The illustrated example shows two columns 92 of thermal arched beam acuators with each column comprising five rows 94 of thermal arched beam actuators disposed on the surface of the microelectronic substrate 12. The physical configuration of the array is shown by way of example, it is also possible and within the inventive concept herein disclosed to configure an array in other patterns. The physical configuration of the array and the number of actuators in the array will, generally, be dictated by the actuation distance desired, the nature of the optical beam being attenuated and the precision of attenuation control required.

MEMS actuator arrays in variable optical attenuators may provide numerous benefits in comparison to variable optical attenuators having only a single MEMS actuator. By configuring the actuators in an array, the attenuator benefits from displacement multiplication, so that larger actuation distances can be realized. Thermal arched beam actuator arrays have been configured in which optical shutters have been displaced up to distances of 600 microns. By providing for larger ranges of actuation it is possible for the attenuator to attenuate unfocussed or wider optical beams. Additionally, the array of actuators will allow for much finer and precise control over the degree of attenuation. The percentage of attenuation is directly related to the actuation distance. In instances where the actuation can vary from 10 microns up to several hundred microns it is possible to precisely control the degree of attenuation by varying the actuators in use within the array. Further discussion of MEMS actuator arrays is omitted from this description so as not to unnecessarily complicate the invention that is disclosed herein. For a more detailed discussion of MEMS actuator arrays see U.S. patent application Ser. No. 09/303, 996 entitled "Multi-Dimensional Scalable Displacement Enabled Microelectromechanical Actuator Structures and Arrays" filed May 3, 1999 in the name of inventor Hill et al., and assigned to MCNC, the assignees of the present invention. The contents of this patent application are hereby incorporated by reference as if fully setforth herein.

Additionally, as shown in FIG. 8 the array configuration of the variable optical attenuator may comprise a clamping element 24 that serves as a means for holding the optical shutter at a prescribed attenuation position. Similar to the single thermal arched beam embodiment, it is possible to actuate the optical shutter to the desired attenuation position, clamp the optical shutter in place and then remove current from the heat sources driving the thermal arched beam actuator array. Thus, the clamping element assists in further reducing the power requirements of the overall variable optical attenuator by eliminating the need for the actuators to maintain standby power. A contact 26 is shown on the substrate and serves to electrically connect the clamping element to the substrate or to an additional electrode buried within the layered substrate structure. The voltage necessary to provide the clampdown action, typically in the range of 20 volts, may be supplied by an external voltage source.

Figure 9:
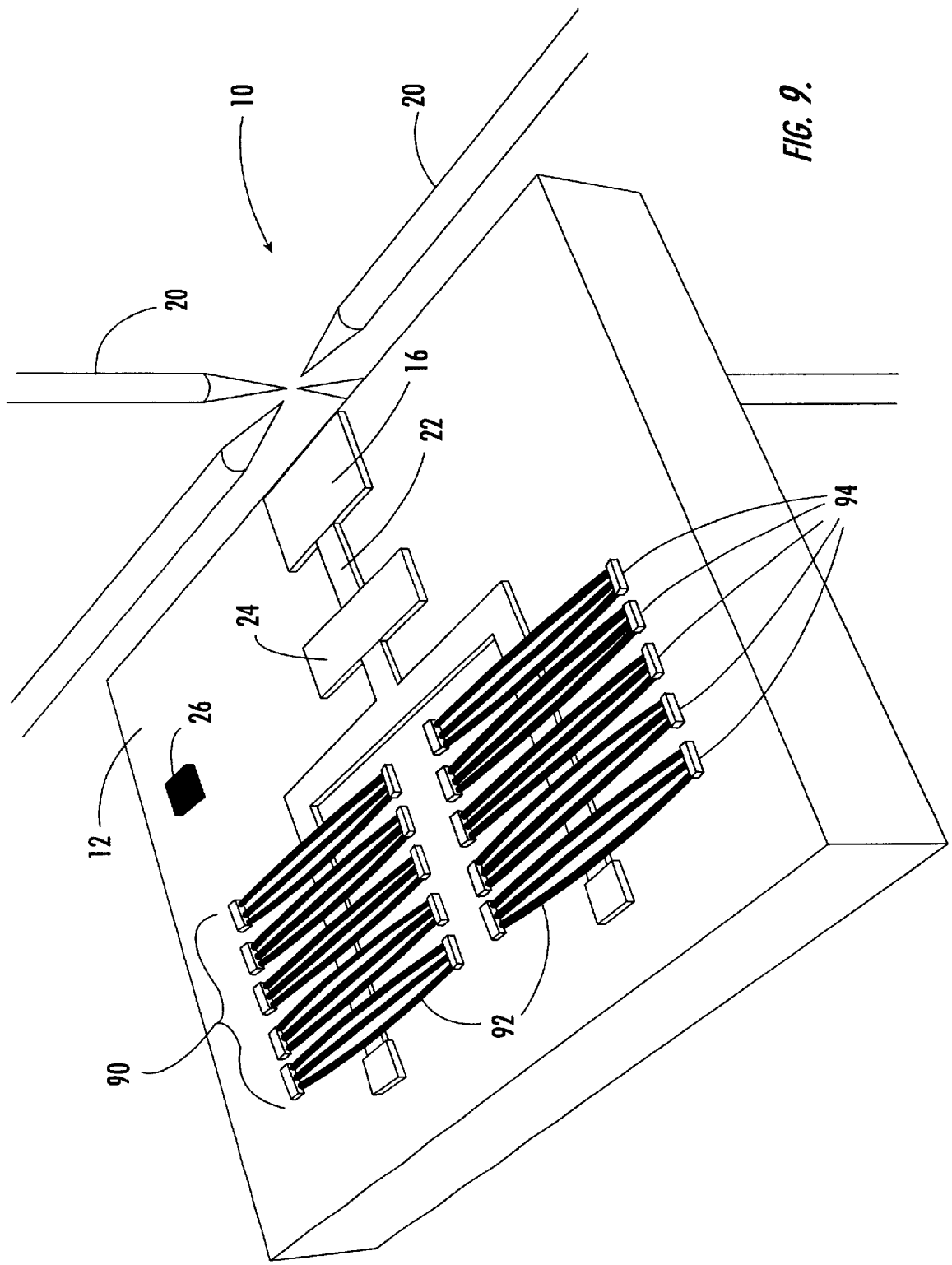
FIG. 9 is a perspective view of a MEMS variable optical attenuator having a plurality of MEMS actuators defining an array and providing attenuation capabilities for use with optical beams having paths beyond the edge of the substrate in accordance with an alternative embodiment of the present invention.

Referring now to FIG. 9, an embodiment of the present invention may also be comprised a variable optical attenuator 10 having a plurality of MEMS actuators assembled to define an array 90 in which the optical shutter 16 can be actuated to move over the edge of the microelectronic substrate 12 and block the passage of optical beams 20 that pass through planes outside the periphery of the microelectronic substrate. As depicted the array of MEMS actuators comprises an array of thermal arched beam acuators. The illustrated example shows two columns 92 of thermal arched beam acuators with each column comprising five rows 94 of thermal arched beam actuators disposed on the surface of the microelectronic substrate 12. The physical configuration of the array is shown by way of example, it is also possible and within the inventive concept herein disclosed to configure an array in other patterns. The physical configuration of the array and the number of actuators in the array will, generally, be dictated by the actuation distance desired, the nature of the optical beam being attenuated and the precision of attenuation control required.

In the FIG. 9 embodiment the optical shutter is displaced laterally in a plane parallel to the microelectronic substrate and over an edge of the microelectronic substrate. In this embodiment the optical shutter is capable of attenuating optical beams that lie in planes both parallel and perpendicular to the plane in which the actuator and shutter lie. The displacement that is provided for by the array of MEMS actuators allows for the optical shutter to be larger in surface area and/or displaced farther out from the edge of the substrate than would be exhibited with a singular MEMS actuator arrangement. In this regard, the variable optical attenuator of this embodiment is capable of attenuating optical beams that have paths of greater distance from the edge of the substrate and/or optical beams that are unfocussed or wider at the point of attenuation.

Figure 10:
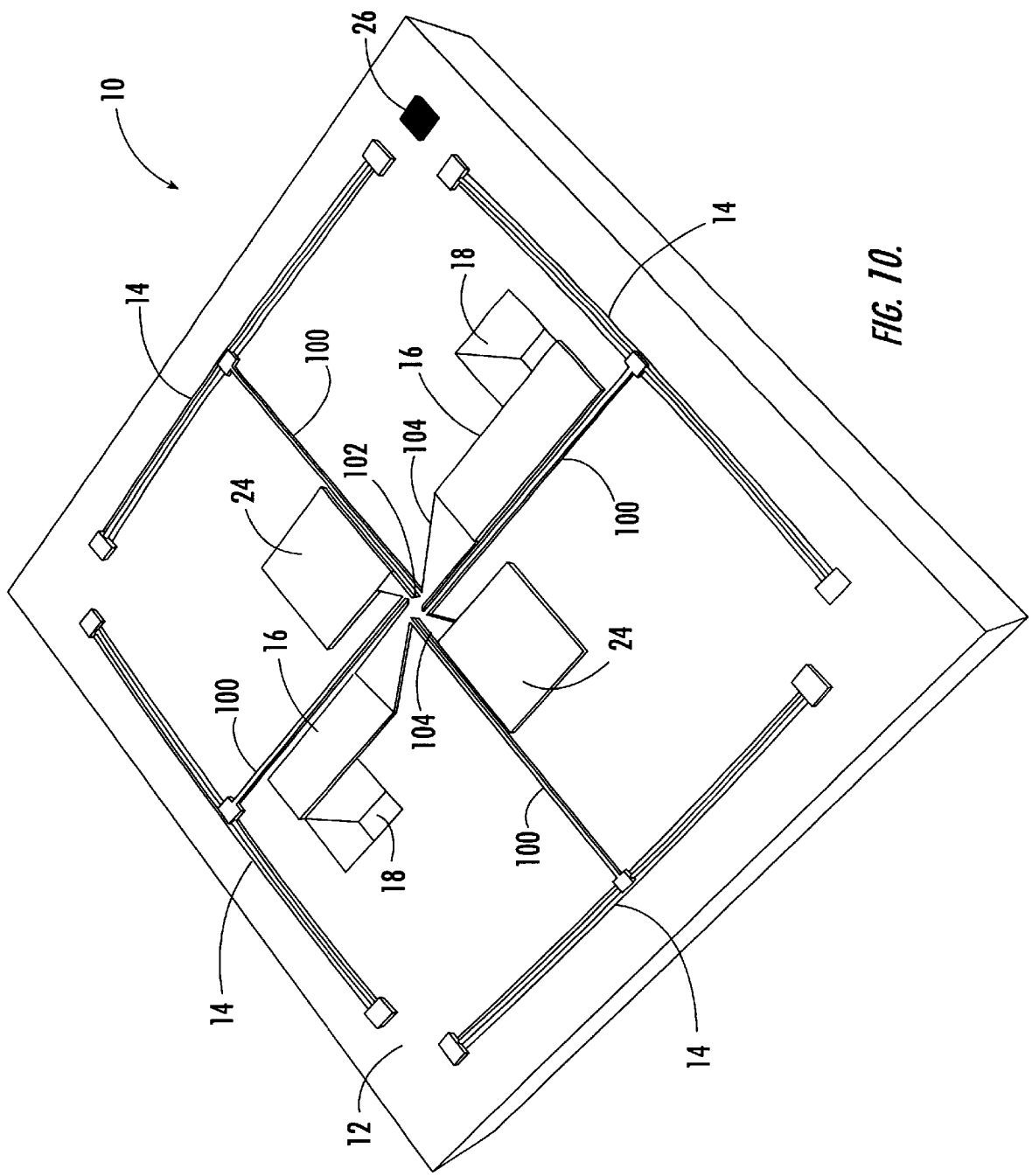
FIG. 10 is a perspective view of a MEMS variable optical attenuator having a rotary-hub actuation structure in accordance with an alternate embodiment of the present invention.

A variation on the array configuration described above is shown in the embodiment of the present invention depicted in FIG. 10. A MEMS actuator-driven, rotary hub variable optical attenuator 10 comprise at least two MEMS actuator 14, at least one hub spoke 100 leading from the MEMS actuators to a central hub 102, and at least one lever 104 extending for the hub that carries optical shutters 16 and/or clamping elements 24. As depicted the array of MEMS actuators surrounding the central hub comprises an array of thermal arched beam acuators. The use of thermal arched beam actuators is shown by way of example, it also possible and within the inventive concept herein disclosed to configure an array with other MEMS actuators that provide the necessary variability and precision needed to control the attenuator. Each hub spoke is operably connected to both a thermal arched beam actuator and the hub, and serves to transmit rotational force from the thermal arched beam actuators to the hub. Each hub spoke is operably connected to the arched beams of the respective thermal arched beam actuators such that thermal actuation of the thermal arched beam actuator will cause the arched beams to further arch in a predetermined direction, thereby moving the hub spoke in the predetermined direction. Each hub spoke is thereby disposed to impart rotational force to the operably connected hub.

The thermal arched beam actuators can be disposed to rotate the hub in either a clockwise or counterclockwise direction within a particular MEMS rotary structure. In contrast, another embodiment may include thermal arched beam actuators disposed about the hub to provide both clockwise and counterclockwise rotation within a MEMS rotary structure. Depending on which thermal arched beam actuators are supplied with heat the hub may be selectively rotated in a clockwise or counterclockwise direction.

The levers extending from the hub will rotate with the hub and can be used to transmit force. In this illustration two levers are attached to optical shutters 16. The optical shutters in this embodiment serve to attenuate optical beams (not shown in FIG. 10) that pass through the openings 18 in the microelectronic substrate 12. The optical shutter, as shown, may be rectangular in shape or the optical shutter may be configured so as to accommodate full coverage of the openings and/or the width of the optical beams. Variable optical attenuators using a rotary hub array benefit from being able to provide actuation over a large area. In similar fashion to non-rotary arrays, rotary type arrays that provide for larger ranges of actuation make it possible to attenuate unfocussed or wider optical beams. Additionally, the array of actuators in combination with the rotary hub will allow for much finer and precise control over the degree of attenuation.

Additionally, the levers of the rotary actuator embodiment may be attached to clamping elements 24. Although different levers carry the clamping elements than carry the optical shutters in the illustrated embodiment, a single lever can carry both a clamping element and an optical shutter. The clamping elements provide the means to lock the optical shutters in at a desired attenuation position. Similar to the clamping elements previously discussed, it is possible to actuate the optical shutter to the desired attenuation position, clamp the optical shutter in place by activating the clamping element and then remove current from the heat sources driving the thermal arched beam actuator array. Thus, the clamping element assists in further reducing the power requirements of the overall variable optical attenuator by eliminating the need for the actuators to maintain standby power. A contact 26 is shown on the substrate and serves to electrically connect the clamping element to the substrate or to an additional electrode buried within the layered substrate structure. The voltage necessary to provide the clampdown action, typically in the range of 20 volts, may be supplied by an external voltage source.

Further discussion of rotary type actuators is omitted from this description so as not to unnecessarily complicate the invention that is disclosed herein. For a more detailed discussion of rotary type actuators see U.S. patent application Ser. No. 09/275,058 entitled "Microelectromechanical Rotary Structure" filed May 23, 1999 in the name of inventor Hill and assigned to MCNC, the assignees of the present invention. The contents of this patent application are hereby incorporated by reference as if fully setforth herein.

Figure 11:
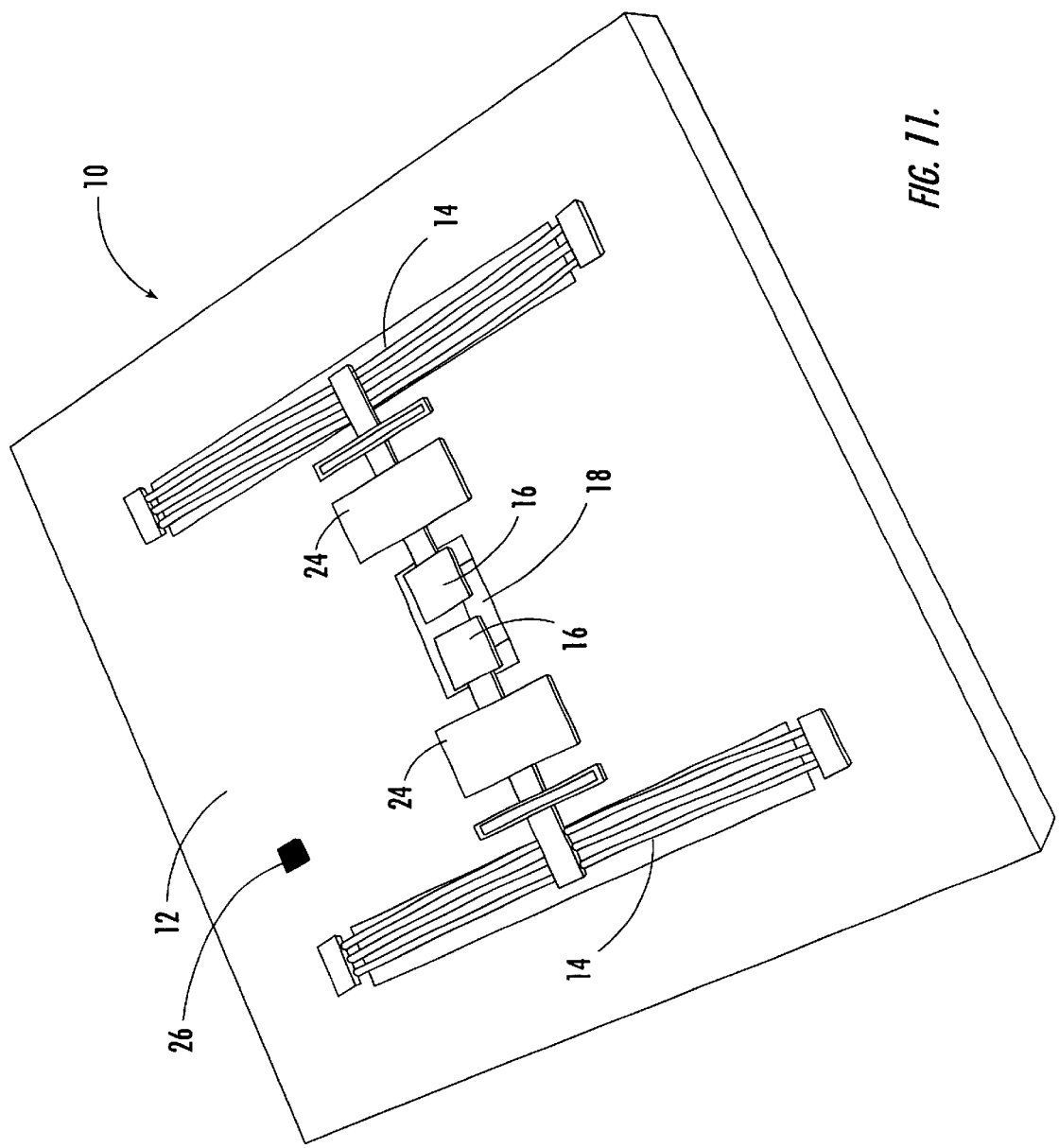
FIG. 11 is a perspective view of a MEMS variable optical attenuator having dual optical shutters in accordance with an alternate embodiment of the present invention.

The present invention is also embodied in a configuration having two or more optical shutters attenuating one optical beam. FIG. 11 illustrates an example of a variable optical attenuator having two MEMS actuators 14 and two optical shutters 16 working in unison to attenuate an optical beam (not shown in FIG. 11) that passes through an opening 18 in the microelectronic substrate 12. The use of two MEMS actuators and two optical shutters is shown by way of example only, it is also possible and within the scope of this invention to configure the variable optical attenuator with more than two MEMS actuators and/or more than two optical shutters. For example, the attenuator could be configured so that the optical shutters are propelled by an array of MEMS actuators or the attenuator could be configured so optical shutters enter into the attenuation area from each side of the opening. Additionally, the optical shutters can be fabricated with a lip at the edge where the shutters come in contact during actuation so that the shutters present a continuous closed surface that is capable of blocking the entirety of the optical beam. This embodiment of the present invention benefits from being able to actuate the plurality of optical shutters over a larger displacement area, thus allowing for full optical power range attenuation of optical beams that are unfocussed or have wider optical beams. This embodiment can accomplish this degree of attenuation without using a more complex MEMS actuator array or a rotary hub-type actuator assembly. As shown in other variable optical attenuator embodiments, this embodiment also benefits from the inclusion of clamping elements 24 that are incorporated to provide a means to lock the optical shutters in at a desired attenuation position.

Figure 12:
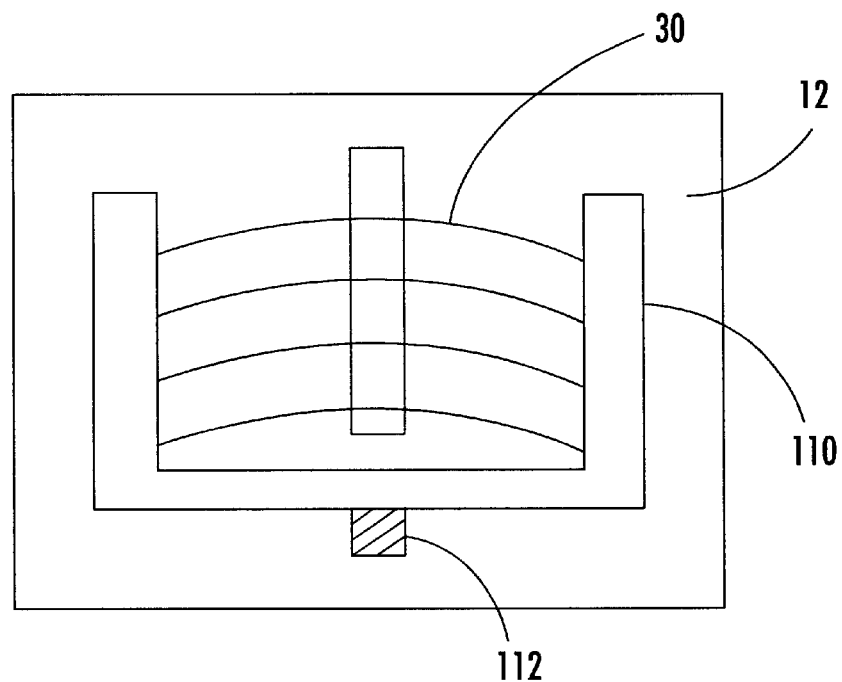
FIG. 12 is a top view of a MEMS thermal beam arched actuator having a temperature compensation element as implemented in the present invention.

In various embodiments of the present invention that use thermally dependent MEMS actuators, the embodiments will benefit from the incorporation of temperature compensation elements. The use of temperature compensating elements is most beneficial in instances where the microelectronic substrate and the MEMS actuator are formed of different materials. Thus, in applications in which the substrate is silicon and the actuator is formed from a metal, such as nickel, the temperature compensating element would be desirable. However, in applications in which the substrate is formed of silicon and the actuator is formed of silicon the overall device is intrinsically temperature compensated and thus, no additional temperature compensating means are necessary. The need for temperature compensating elements exists because unpredictable or erroneous movement of the MEMS actuators can result due to changes in ambient operating temperature. Temperature compensation elements can alleviate the problems inherent in ambient temperature fluctuations affecting the thermally dependent MEMS actuator devices and, ultimately, affecting the variable optical attenuators of the present invention. FIG. 12 illustrates a top-view example of one type of temperature compensation element that can used to compensate for ambient temperature variance in a thermal arched beam actuator. The temperature compensation element comprises a microelectronic substrate 12, a thermal arched beam actuator 30 and a frame 110 acting as a temperature compensation element.

In this example of a temperature compensation element, the frame and thermal arched beam actuator overlie the generally planar surface of the microelectronic substrate. In some applications, a heating element (not shown in FIG. 12) may lie on the surface of the substrate with the arched beams raised above and the frame enclosing the heating element. As shown in FIG. 12 the frame may serve as the arched beam supports or additional supports may be fabricated on the frame. The frame is disposed upon the generally planar surface of the substrate and adapted for thermal actuation so as to move in response to changes in ambient temperature. The frame includes one or more anchors, such as anchor 112; the anchors serve as the fixed point between the substrate and the frame with the remainder of the frame being suspended above the substrate by the anchor(s). Additionally, the thermal arched beam actuator is operably connected to the frame and is adapted to move in response to the active alteration of the temperature provided for by the heater or other means of active heat.

The temperature compensated thermal arched beam actuator is designed such that in the absence of active alteration of the temperature, the frame and the thermal arched beam actuator cooperatively move in response to changes in ambient temperature to thereby substantially maintain the actuating element in substantially the same relative position with respect to the substrate. In most instances this would result in the actuator member 22 remaining stationary with respect to the substrate during fluctuations in ambient temperature while the frame and the arched beams contract and expand accordingly to compensate for the variations.

The type of temperature compensating element shown in FIG. 12 is shown by way of example. Other temperature compensation elements may also be used with the variable optical attenuator herein disclosed without departing from the scope of the invention. A more detailed discussion of temperature compensation elements is omitted from this disclosure so as not to unnecessarily complicate the invention that is disclosed herein. For a more detailed discussion of temperature compensation elements see U.S. patent application Ser. No. 09/261,483 entitled "Temperature Compensated Microelectromechanical Structures and Related Methods" filed Feb. 26, 1999 in the name of inventors Hill et al., and assigned to MCNC, the assignees of the present invention. The contents of this patent application are hereby incorporated by reference as if fully setforth herein.

Figure 13:
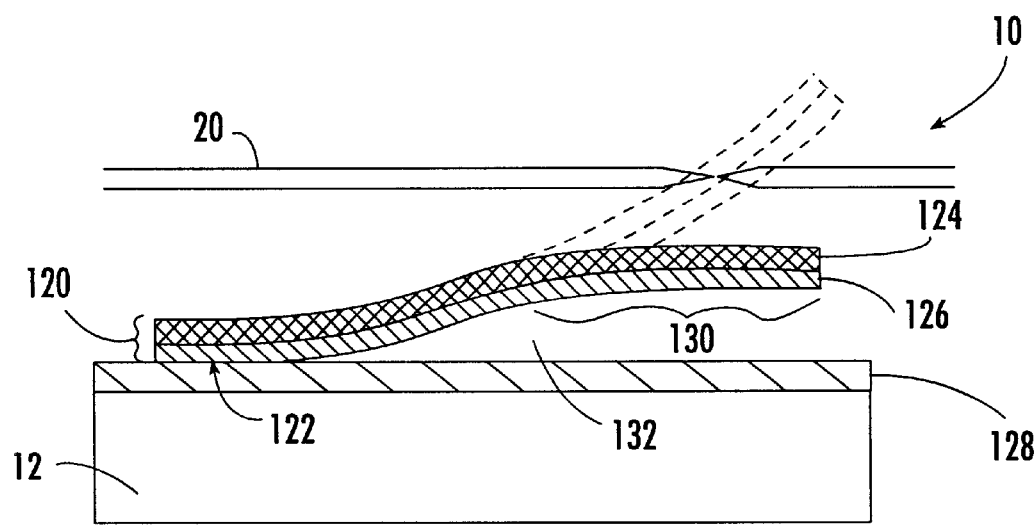
FIG. 13 is a cross-sectional view of a MEMS variable optical attenuator comprising a thermal bimorph cantilever structure that attenuates an optical beam lying in a plane above the surface of the substrate in accordance with an alternate embodiment of the present invention.

The present invention is also represented in another embodiment of the MEMS variable optical attenuator that uses a thermal bimorph cantilever structure as the means for attenuation. FIG. 13 shows a cross-sectional view of a thermal bimorph cantilever variable optical attenuator 10 used to attenuate an optical beam 20 in accordance with the present invention. The variable optical attenuator comprises a microelectronic substrate 12 having a bimorph cantilever structure 120 attached to the substrate at one end 122. The bimorph cantilever structure includes two or more layers of differing thermal coefficients of expansion that respond differently to thermal actuation, shown in FIG. 13 as first layer 124 and second layer 126. When electrical current is passed through the first layer and/or the second layer, the thermal bimorph cantilever is heated up and responds by bending in the direction of the material having the lower coefficient of thermal expansion. In this embodiment, heating the bimorph structure causes the cantilever to bend upwards and intercept the path of the optical beam 20 that lies in a plane generally parallel to the planar surface of the substrate. As the bimorph enters into the plane of the optical beam it serves to partially or fully attenuate the optical beam as long as current is supplied to the bimorph. It is also feasible and within the inventive concepts herein disclosed to configure the bimorph so that it moves in response to thermal activation in a direction parallel to the plane of the substrate. In this type of arrangement the layers of the bimorph are stacked vertically as opposed to horizontally to impart movement of the bimorph in a direction parallel to the surface of the substrate. Such a bimorph configuration is capable of attenuating optical beams that are parallel to the surface of substrate and adjacent to the thermal bimorph structure. See for example, U.S. patent application Ser. No. 09/395,068 entitled "In-Plane MEMS Thermal Actuator and Associated Fabrication Methods" filed on Sep. 13, 1999 in the name of inventors Dhuler et. al., and assigned to MCNC, the assignors of the present invention.

Microelectronic substrate 12 defines a planar surface upon which the variable optical attenuator is constructed. Preferably the microelectronic substrate comprises a silicon wafer, although other suitable substrate materials having a generally planar surface can be used. By way of example, quartz, glass or polymeric materials may be used to form the substrate. A dielectric layer 128 may, optionally, overlay the planar surface of the microelectronic substrate. The dielectric layer acts as an insulating layer and provides when necessary electrical insulation between the substrate and the thermal bimorph structure. The dielectric layer preferably comprises a non-oxidation-based insulator or polymer, such as silicon nitride. In this application, oxide based insulators are avoided if certain acids (such as hydrofluoric acid) are used in further processing to remove the sacrificial release layer. The dielectric layer is preferably formed by using a standard deposition technique, such as low-pressure chemical vapor deposition (LPCVD).

A release layer (not shown in FIG. 13) is deposited on the planar surface of the substrate in the area underlying the non-affixed distal portion 130 of the overlying thermal bimorph structure. Preferably, the sacrificial release layer comprises an oxide or other suitable material that may be etched away when acid is applied thereto. After the overlying layers of the thermal bimorph structure have been deposited on the substrate, the release layer may be removed through standard microengineering acidic etching techniques, such as a hydrofluoric acid etch. When the release layer has been removed, the non-affixed, distal portion of the thermal bimorph is separated from the underlying planar surface, creating the air gap 132 between the thermal bimorph and the underlying planar surface.

The layers of the thermal bimorph generally overlie the planar surface of the substrate. Known integrated circuit manufacturing processes are used to construct the layers comprising the thermal bimorph. The thermal bimorph will comprise at least two layers of material that characteristically have different thermal coefficients of expansion. The variance in thermal coefficients of expansion will result in the layers responding differently when heat is applied to the bimorph structure. The first layer 124 may comprise a material having a lower coefficient of expansion in respect to the second layer 126, while the second layer 126 may comprise a material having a higher coefficient of expansion in respect to the first layer. By way of example the first and second layers may be formed of metallic materials having varying coefficients of thermal expansion.

In operation, the distal portion of the thermal bimorph is adapted to bend, resulting in the controlled movement along a predetermined path in response to selective thermal actuation thereof. Since the layer having the higher thermal coefficient of expansion will expand more as temperature increases, the distal portion will bend toward the layer having the lower thermal coefficient of expansion. In the example above, the second layer will expand causing the distal portion to bend toward the first layer. This bending motion will cause the thermal bimorph to bend upwards and intersect the path of the optical beam. The optical beam can be partially attenuated or fully attenuated by the blockage induced by the thermal bimorph. Attenuation of the optical beam will continue as long as the bimorph is heated by supplying it with an electrical current to the first layer, the second layer or both layers of the bimorph structure.

It is also possible to construct the bimorph so that fabrication stresses cause the bimorph to curl in the non-thermally activated state. In this bimorph construct the curled bimorph lies in a plane that intercepts the path of the optical beam thus, partially or fully attenuating the optical beam in the non-thermally activated state. Upon heating, the bimorph uncurls to allow for partial or full passage of the optical beam. In one such example, the first layer 124 may comprise gold or nickel, while the second layer 126 may comprise poly-silicon.

Figure 14A:
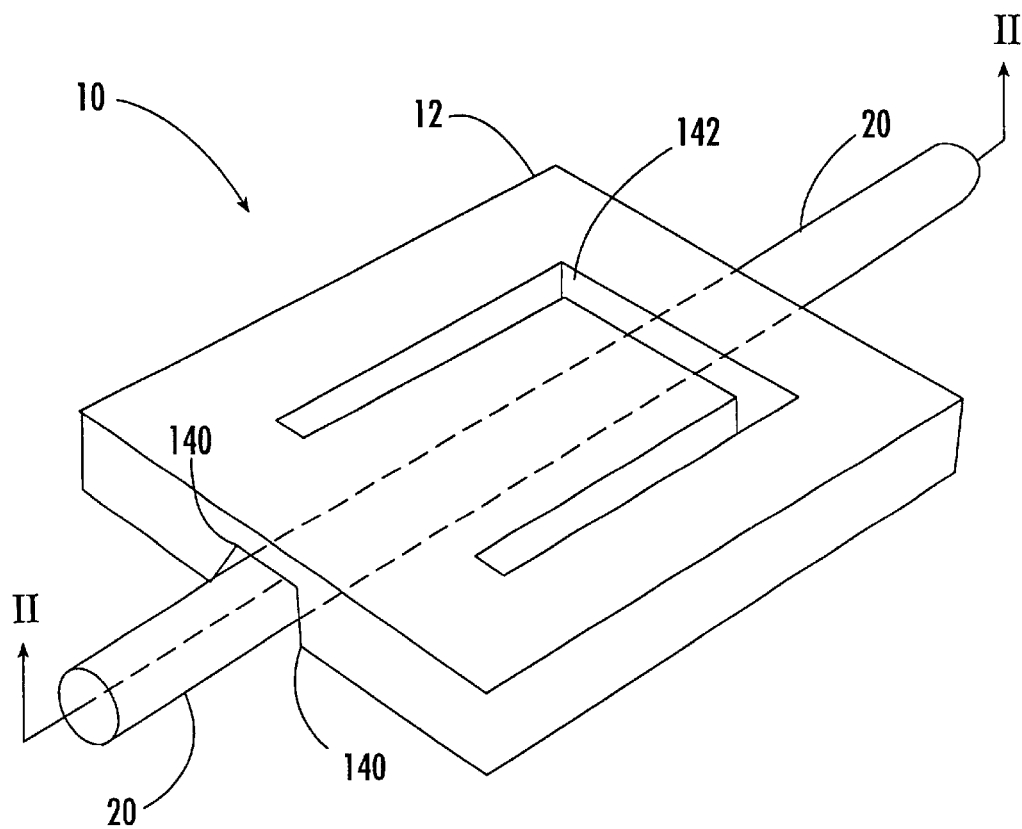
FIG. 14A is a perspective view of a MEMS variable optical attenuator comprising a thermal bimorph cantilever structure that attenuates an optical beam lying in a plane below or through the surface of the substrate in accordance with an alternate embodiment of the present invention.
Figure 14B:
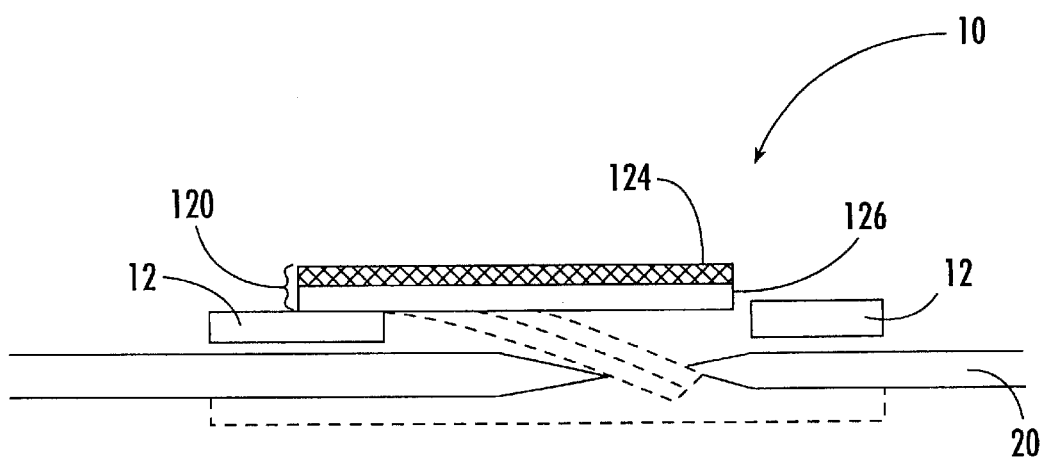
FIG. 14B is a cross-sectional view of a MEMS variable optical attenuator comprising a thermal bimorph cantilever structure taken along line A—A of FIG. 14A that attenuates an optical beam lying in a plane below or through the surface of the substrate in accordance with an alternate embodiment of the present invention.

Additionally, the thermal bimorph variable optical attenuator may comprise a thermal bimorph cantilever that upon heating bends downward toward the substrate and intersects the path of an optical beam running through the surface of the substrate or below the surface of the substrate. FIGS. 14A and 14B illustrate an example of a thermal bimorph variable optical attenuator 10 that attenuates an optical beam 20 that has a path through the microelectronic substrate 12. FIG. 14A depicts a perspective view of the thermal bimorph variable optical attenuator and FIG. 14B depicts a cross-sectional view. In this embodiment the backside of the microelectronic substrate has a trench 140 formed therein. The trench, which is typically formed by a conventional etching process, serves as the path for which the optical beam travels through. Additionally, the substrate has an opening 142 that allows for the thermal bimorph cantilever to travel downward, into the substrate opening and intersect the path of the optical beam. A standard etching technique may be used to form the opening in the substrate.

Similar to the thermal bimorph that moved upward and away from the substrate, the thermal bimorph in this embodiment will comprise at least two layers of material that characteristically have different thermal coefficients of expansion. The first layer 124 may comprise a metallic material, such as gold or nickel, while the second layer 126 may comprise a semiconductor material, such as silicon, or a metallic material. In this example, the second layer will have a characteristically lower thermal coefficient of expansion than the first layer. The first layer will expand causing the distal portion to bend toward the second layer. This bending motion will cause the thermal bimorph to bend downwards and intersect the path of the optical beam. The optical beam can be partially attenuated or fully attenuated by the blockage induced by the thermal bimorph. Attenuation of the optical beam will continue as long as the bimorph is heated by supplying it with an electrical current to the first layer, the second layer or both layers of the bimorph structure.

All embodiments shown and described encompass the MEMS variable optical attenuator of the present invention. The variable optical attenuator of the present invention can be advantageously held in any desired attenuation position to provide controllable attenuation between an optical power range of 0 to 100%. Various embodiments of the invention provide for attenuation of extended areas, allowing for attenuation of optical beams that are unfocussed or have wide cross-sectional areas. Additionally, the variable optical attenuator of the present invention decreases the need for standby power to be used as the mechanism to hold the optical shutter in place by providing for a clamping mechanism to lock the shutter in at a desired attenuation position.

Many modifications and other embodiments of the invention will come to mind to one skilled in the art to which this invention pertains having the benefit of the teachings presented in the foregoing descriptions and the associated drawings. Therefore, it is to be understood that the invention is not to be limited to the specific embodiments disclosed and that modifications and other embodiments are intended to be included within the scope of the appended Claims. Although specific terms are employed herein, they are used in a generic and descriptive sense only and not for purposes of limitation.

That which is claimed:

1. A MEMS device for optically attenuating an optical beam, comprising:
   a microelectronic substrate having a generally planar surface;
   a microelectronic actuator disposed on the generally planar surface of said microelectronic substrate; and
   an optical shutter disposed on the generally planar surface of said microelectronic substrate, wherein said optical shutter is actuatable by said microelectronic actuator and is adapted to be held at any one of a plurality of positions, and wherein said optical shutter is configured to block a different percentage of optical power in each position such that said optical shutter can block any percentage of optical power within an optical power range.

2. A MEMS device according to claim 1, further comprising:
   an electrostatic clamping element disposed on said substrate and operably connected to said optical shutter that allows for said optical shutter to be electrostatically clamped at a desired attenuation position;
   an electrostatic contact on said substrate which is electrostatically coupled to said electrostatic clamping element; and
   means for applying an electrostatic force between said electrostatic clamping element and said electrostatic contact.

3. A MEMS device according to claim 2 wherein said electrostatic clamping element is comprised of a metal.

4. A MEMS device according to claim 2 wherein said electrostatic clamping element is comprised of a semiconductor-metal composite.

5. A MEMS device according to claim 1, wherein said microelectronic actuator further comprises a thermal arched beam actuator.

6. A MEMS device according to claim 5, further comprising a means for applying heat to said arched beam actuator to cause further arching of the arched beam, thereby actuating said optical shutter.

7. A MEMS device according to claim 6, wherein said means for applying heat further comprises an external heater disposed proximate to said actuator.

8. A MEMS device according to claim 5, further comprising an actuator member that is configured to be displaced by said thermal arched beam actuator and attaches said optical shutter to said thermal arched beam actuator.

9. A MEMS device according to claim 5, further comprising a temperature compensation element on said microelectronic substrate and adapted to prevent said actuator from actuating in response to changes in ambient temperature.

10. A MEMS device according to claim 9, wherein said temperature compensation element further comprises a rigid frame structure surrounding said thermal arched beam actuator, said rigid frame structure having at least one anchor point affixing said rigid frame structure to said substrate, the remainder of the frame suspended above said substrate and operably connected to said thermal arched beam actuator.

11. A MEMS device according to claim 1, further comprising a support structure for supporting said optical shutter on said substrate.

12. A MEMS device according to claim 11, wherein said support structure further comprises a folded beam suspension structure.

13. A MEMS device according to claim 1, wherein said microelectronic actuator further comprises an array of microelectronic actuators.

14. A MEMS device according to claim 13, wherein said array of microelectronic actuators further comprises an array of thermal arched beam actuators.

15. A MEMS device according to claim 14, further comprising means for applying heat to said array of thermal arched beam actuators to cause further arching of the arched beams, thereby actuating said optical shutter.

16. A MEMS device according to claim 15, wherein said means for applying heat further comprises at least one external heater disposed proximate to said array of microelectronic actuators.

17. A MEMS device according to claim 14, further comprising at least one temperature compensation element on said microelectronic substrate and adapted to prevent said actuators from actuating in response to changes in ambient temperature.

18. A MEMS device according to claim 17, wherein said at least one temperature compensation element further comprises at least one rigid frame structure surrounding said array of thermal arched beam actuators, said rigid frame structure having at least one anchor point affixing said rigid frame structure to said substrate, the remainder of the frame suspended above said substrate and operably connected to said array of thermal arched beam actuators.

19. A MEMS device according to claim 14, further comprising a central hub disposed on the microelectronic substrate having at least two hub spokes operably connected to at least one MEMS actuator within said array and at least one lever operably connected to said central hub and said optical shutter, wherein said MEMS actuators are configured to provide the force to move said at least two hub spokes, thereby imposing a rotational force upon said central hub that moves said at least one lever so as to cause said optical shutter to attenuate an optical beam.

20. A MEMS device according to claim 19, further comprising at least one lever operably connected to said central hub and a clamping element attached to said at least one lever wherein said MEMS actuators are configured to provide the force to move said at least two hub spokes, thereby imposing a rotational force upon said central hub that moves said at least one lever so as to cause said clamping element to reach a position where a clampdown voltage may be applied.

21. A MEMS device according to claim 20, wherein said microelectronic substrate defines at least one opening spaced proximate to said central hub, and wherein said optical shutter further comprises at least one optical shutter operably coupled to said central hub through at least one lever and adapted to at least partially affect attenuation of optical beams by moving across, respective, said at least one opening.

22. A MEMS device according to claim 14, further comprising an actuator member that is configured to be displaced by said array of thermal arched beam actuators and attaches said optical shutter to said array of thermal arched beam actuators.

23. A MEMS device according to claim 1, wherein said microelectronic actuator further comprises first and second microelectronic actuators and said optical shutter further comprises first and second optical shutters corresponding, respectively, to the first and second microelectronic actuators.

24. A MEMS device according to claim 23, wherein said first and second microelectronic actuators further comprise first and second thermal arched beam actuators.

25. A MEMS device according to claim 24, wherein said first and second thermal arched beam actuators actuate in generally the same plane and in generally opposite direction within the plane.

26. A MEMS device according to claim 25, wherein said first and second optical shutters are shaped to allow for an overlap upon actuation causing the first and second optical shutters to contact each other.

27. A MEMS device according to claim 1, wherein said optical shutter is of a predetermined shape that allows for complete attenuation of the optical beam.

28. A MEMS device according to claim 1, wherein said optical shutter is of a predetermined shape that allows for partial attenuation of the optical beam.

29. A MEMS device according to claim 1, wherein said optical shutter has openings to allow for optical beam passage.

30. A MEMS device according to claim 1, wherein said optical shutter is generally block shaped.

31. A MEMS device according to claim 30, wherein said optical shutter has a predetermined thickness along the faces of the generally block shaped optical shutter.

32. A MEMS device according to claim 1, wherein said optical shutter has a contoured surface.

33. A MEMS device according to claim 1, wherein said optical shutter comprises a metal.

34. A MEMS device according to claim 1, wherein said optical shutter comprises a semiconductor-metal composite.

35. A MEMS device according to claim 1, wherein said microelectronic substrate defines an opening therethrough, the opening allowing for the passage therethrough of the optical beam.

36. A MEMS device according to claim 35, wherein the optical beam has an optical axis generally perpendicular to the generally planar surface of said microelectronic substrate and said optical shutter lies in a plane generally parallel to the generally planar surface of said microelectronic substrate.

37. A MEMS device according to claim 1, wherein said microelectronic substrate further defines a transparent material that allows for an optical beam to be passed therethrough.

38. A MEMS device according to claim 1, wherein said microelectronic substrate defines a trench along the generally planar surface, the trench allowing for the passage therethrough of the optical beam.

39. A MEMS device according to claim 1, wherein the optical beam has an optical axis generally parallel to the generally planar surface of said microelectronic substrate and said optical shutter lies in a plane generally parallel to the generally planar surface of said microelectronic substrate.

40. A MEMS device according to claim 1, wherein said optical shutter is attached to said microelectronic actuator, lies in a plane generally parallel to the generally planar surface of said microelectronic substrate and is capable of being extended beyond an edge of said microelectronic substrate upon actuation, thereby allowing for the attenuation of an optical beam that passes along the edge of said microelectronic substrate.

41. A MEMS device according to claim 40, wherein the optical beam is in a plane generally parallel to the generally planar surface of said microelectronic substrate.

42. A MEMS device according to claim 40, wherein the optical beam is in a plane generally perpendicular to the planar surface of said microelectronic substrate.

43. A MEMS device according to claim 1, wherein said optical shutter lies in a plane generally perpendicular to the generally planar surface of said microelectronic substrate.

44. A MEMS device according to claim 43, wherein said optical shutter is a pop-up shutter released from said substrate during MEMS device fabrication.

45. A MEMS device according to claim 43, wherein said optical shutter is supported on said substrate by a hinged type structure.

46. A MEMS device according to claim 43, wherein said optical shutter is supported on said substrate by a flexible torsional support structure.

47. A MEMS device for optically attenuating an optical beam, comprising:
a microelectronic substrate having a generally planar surface; and
a moveable composite actuator disposed on the planar surface of said microelectronic substrate and adapted for thermal actuation so as to controllably move along a predetermined path and attenuate an optical beam lying in the path of actuation wherein said moveable composite actuator blocks a different percentage of optical power in each position along the path such that said moveable composite actuator can block any percentage of optical power within an optical power range.

48. A MEMS device according to claim 47 wherein said moveable composite actuator further comprises at least two layers which respond differently to thermal actuation, a fixed portion of said composite actuator attached to said microelectronic substrate and a distal portion of said composite actuator adapted to bend so as to controllably move along a predetermined path and attenuate an optical beam lying in the path of actuation.

49. A MEMS device according to claim 48, wherein the distal portion is adapted to move in response to thermal actuation in an upward direction and attenuate an optical beam having an optical path lying above the generally planar surface of said microelectronic substrate.

50. A MEMS device according to claim 48, wherein the distal portion is adapted to move in response to thermal actuation in a downward direction and attenuate an optical beam having an optical path lying below the generally planar surface of said microelectronic substrate.

51. A MEMS device according to claim 50, wherein said microelectronic substrate defines a trench through which the optical beam extends.

52. A MEMS device for optically attenuating an optical beam, comprising:
    a microelectronic substrate having a generally planar surface;
    a microelectronic actuator disposed on the generally planar surface of said microelectronic substrate;
    an optical shutter disposed on the generally planar surface of said microelectronic substrate, wherein said optical shutter is actuatable by said microelectronic actuator and is adapted to attenuate any percentage of optical power within an optical power range;
    an electrostatic clamping element operably connected to said optical shutter that allows for said optical shutter to be electrostatically clamped at a desired attenuation position;
    an electrostatic contact on said substrate which is electrostatically coupled to said electrostatic clamping element; and
    means for applying an electrostatic force between said electrostatic clamping element and said electrostatic contact.

53. A system for variable optical attenuation, the system comprising:
    a MEMS variable optical attenuator having a microelectronic substrate having a generally planar surface, a microelectronic actuator disposed on the generally planar surface of said microelectronic substrate, an optical shutter disposed on the generally planar surface of said microelectronic substrate, an electrostatic clamping element operably connected to said optical shutter that allows for said optical shutter to be electrostatically clamped at a desired attenuation position;
    an electrostatic contact on said substrate which is electrostatically coupled to said electrostatic clamping element; and
    a voltage source for applying an electrostatic force between said electrostatic clamping element and said electrostatic contact.

54. A method for optical attenuation using a MEMS variable optical attenuator having a microelectronic substrate having a generally planar surface, a microelectronic actuator disposed on the generally planar surface of said microelectronic substrate, an optical shutter disposed on the generally planar surface of said microelectronic substrate, an electrostatic clamping element disposed on said substrate, the method comprising the steps of:
    activating the microelectronic actuator;
    actuating the optical shutter by way of the microelectronic actuator so that the optical shutter is placed in a prescribed attenuation position so as to intersect at least a portion of a plane through which an optical beam passes;
    activating electrostatically the clamping element thereby locking the optical shutter at the prescribed attenuation position; and
    deactivating the microelectronic actuator while the optical shutter is locked at the prescribed attenuation position.

55. A method of fabricating a MEMS variable optical attenuator comprising:
    forming an oxide layer on a generally first planar surface of a microelectronic substrate;
    forming a silicon layer on the oxide layer;
    defining a mechanical structure of the attenuator in the silicon layer, the mechanical structure defining a thermal arched beam actuator, an actuator member and an optical shutter;
    releasing a portion of the silicon layer from the substrate by etching away the oxide layer underlying the arched beams of the thermal arched beam actuator and the actuator member;
    doping at least a portion of the silicon layer to provide a predetermined conductivity; and
    etching a second surface of the microelectronic substrate, opposite the first surface, and etching the oxide layer underlying the optical shutter to release the optical shutter from the substrate.

56. The method of claim 55, wherein said defining step further defines the mechanical structure as including a clamping element and said releasing step further includes the etching away of the oxide layer underlying the clamping element.

57. The method of claim 56 further comprising the steps of:
    oxidizing the underside of the clamping element following said releasing step to provide a dielectric between the substrate and the clamping element; and
    defining a metal electrode on the first surface of said substrate to provide an electrical connection for the clamping element.

58. The method of claim 56 wherein said defining step further comprises defining the mechanical structure to include etch holes in the clamping element and the actuator member so as to facilitate later release from the substrate.

59. The method of claim 55, wherein said defining a mechanical structure step further comprises the substeps of:
    patterning a mask defining the mechanical structure on the silicon layer; and
    etching away the silicon layer in accordance with patterned mask to define the mechanical structure.

60. The method of claim 55 wherein said forming the silicon layer step further comprises using an epitaxial process to grow single crystal silicon on the substrate.

61. The method of claim 55 wherein said forming the silicon layer step further comprises fusion bonding a single crystal silicon layer to the substrate and oxide construct.

62. The method of claim 55 further comprising the step of metalizing the optical shutter following said defining the mechanical structure step to provide non-optically transmitting surfaces.

63. The method of claim 55 wherein said defining step further comprises defining the mechanical structure to include etch holes in the optical shutter and the actuator member.

* * * * *